(12) United States Patent
Fleming et al.

(10) Patent No.: US 7,261,950 B2
(45) Date of Patent: Aug. 28, 2007

(54) FLEXIBLE, FORMABLE CONDUCTIVE FILMS

(75) Inventors: Robert J. Fleming, St. Paul, MN (US); Peter D. Condo, Lake Elmo, MN (US); Edward J. Anderson, Somerset, WI (US); Clark I. Bright, Tucson, AZ (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/521,827

(22) PCT Filed: Aug. 15, 2003

(86) PCT No.: PCT/US03/25662

§ 371 (c)(1),
(2), (4) Date: Jan. 21, 2005

(87) PCT Pub. No.: WO2004/017701

PCT Pub. Date: Feb. 26, 2004

(65) Prior Publication Data

US 2005/0247470 A1    Nov. 10, 2005

Related U.S. Application Data

(63) Continuation-in-part of application No. 10/222,465, filed on Aug. 17, 2002, now Pat. No. 6,818,291.

(51) Int. Cl.
*B32B 15/04* (2006.01)
*B32B 15/08* (2006.01)
*B32B 15/082* (2006.01)
*H05K 9/00* (2006.01)

(52) U.S. Cl. ............ 428/626; 428/34.1; 428/215; 428/216; 428/220; 428/332; 428/457; 428/461; 428/601; 428/673; 174/50; 174/350

(58) Field of Classification Search ............... 428/626, 428/673, 686, 457, 460, 929, 595, 601, 598, 428/625, 34.1, 409, 35.7, 461, 35.8, 332, 428/220, 215, 216, 336; 174/35 R, 51, 50; 359/585

See application file for complete search history.

(56) References Cited

U.S. PATENT DOCUMENTS

| 3,302,002 A | 1/1967 | Warren |
| 3,311,517 A | 3/1967 | Keslar et al. |
| 3,529,074 A | 9/1970 | Lewis |

(Continued)

FOREIGN PATENT DOCUMENTS

| EP | 0 810 452 A2 | 12/1997 |
| EP | 0 873 839 A1 | 10/1998 |
| EP | 0 944 299 A2 | 9/1999 |

(Continued)

OTHER PUBLICATIONS

Aluminum Foil with Conductive Adhesive Data Sheet, 3M Electrical Products Division, 1998, pp. 1-2, no month.

(Continued)

*Primary Examiner*—Michael E Lavilla
(74) *Attorney, Agent, or Firm*—Pamela L. Stewart; Lisa P. Fulton

(57) ABSTRACT

Electrically conductive films comprising a flexible support, an extensible metal or metal alloy layer, and a crosslinked polymeric protective layer have at least one permanently deformed curved region. The films can be light transmissive and can have regions of compound curvature, and the metal or metal alloy layer can be substantially continuous. The films have reduced susceptibility to fracture or corrosion compared to commercially available electromagnetic interference (EMI) shielding films.

17 Claims, 13 Drawing Sheets

U.S. PATENT DOCUMENTS

| | | | |
|---|---|---|---|
| 3,601,471 A | 8/1971 | Seddon et al. | |
| 3,682,528 A | 8/1972 | Apfel et al. | |
| 3,752,348 A | 8/1973 | Dickason et al. | |
| 3,897,140 A | 7/1975 | Tuthill | |
| 3,990,784 A | 11/1976 | Gelber | |
| 4,017,661 A | 4/1977 | Gillery | |
| 4,166,876 A | 9/1979 | Chiba et al. | |
| 4,226,910 A | 10/1980 | Dahlen et al. | |
| 4,234,654 A | 11/1980 | Yatabe et al. | |
| 4,320,169 A | 3/1982 | Yatabe et al. | |
| 4,413,877 A | 11/1983 | Suzuki et al. | |
| 4,590,118 A | 5/1986 | Yatabe et al. | |
| 4,639,069 A | 1/1987 | Yatabe et al. | |
| 4,645,714 A | 2/1987 | Roche et al. | |
| 4,696,719 A | 9/1987 | Bischoff | |
| 4,722,515 A | 2/1988 | Ham | |
| 4,782,216 A | 11/1988 | Woodard | |
| 4,786,783 A | 11/1988 | Woodard | |
| 4,799,745 A | 1/1989 | Meyer et al. | |
| 4,842,893 A | 6/1989 | Yializis et al. | |
| 4,888,061 A | 12/1989 | Wenz | |
| 4,910,090 A | 3/1990 | Kuhlman et al. | |
| 4,954,371 A | 9/1990 | Yializis | |
| 4,965,408 A | 10/1990 | Chapman et al. | |
| 4,973,511 A | 11/1990 | Farmer et al. | |
| 5,011,585 A | 4/1991 | Brochot et al. | |
| 5,018,048 A | 5/1991 | Shaw et al. | |
| 5,032,461 A | 7/1991 | Shaw et al. | |
| 5,071,206 A | 12/1991 | Hood et al. | |
| 5,085,141 A | 2/1992 | Triffaux | |
| 5,097,800 A | 3/1992 | Shaw et al. | |
| 5,125,138 A | 6/1992 | Shaw et al. | |
| 5,260,095 A | 11/1993 | Affinito | |
| 5,324,374 A | 6/1994 | Harmand et al. | |
| 5,332,888 A | 7/1994 | Tausch et al. | |
| 5,360,659 A | 11/1994 | Arends et al. | |
| 5,395,644 A | 3/1995 | Affinito | |
| 5,440,446 A | 8/1995 | Shaw et al. | |
| 5,489,489 A | 2/1996 | Swirbel et al. | |
| 5,547,508 A | 8/1996 | Affinito | |
| 5,681,615 A | 10/1997 | Affinito et al. | |
| 5,681,666 A | 10/1997 | Treger et al. | |
| 5,686,360 A | 11/1997 | Harvey, III et al. | |
| 5,699,188 A | 12/1997 | Gilbert et al. | |
| 5,725,909 A | 3/1998 | Shaw et al. | |
| 5,744,227 A | 4/1998 | Bright et al. | |
| 5,757,126 A | 5/1998 | Harvey, III et al. | |
| 5,771,562 A | 6/1998 | Harvey, III et al. | |
| 5,773,102 A | 6/1998 | Rehfeld | |
| 5,783,049 A | 7/1998 | Bright et al. | |
| 5,877,895 A | 3/1999 | Shaw et al. | |
| 5,981,059 A | 11/1999 | Bright et al. | |
| 6,007,901 A | 12/1999 | Maschwitz et al. | |
| 6,030,671 A | 2/2000 | Yang et al. | |
| 6,045,864 A | 4/2000 | Lyons et al. | |
| 6,049,419 A | 4/2000 | Wheatley et al. | |
| 6,083,628 A | 7/2000 | Yializis | |
| 6,111,698 A | 8/2000 | Woodard et al. | |
| 6,146,225 A | 11/2000 | Sheats et al. | |
| 6,214,422 B1 | 4/2001 | Yializis | |
| 6,231,939 B1 | 5/2001 | Shaw et al. | |
| 6,243,201 B1 | 6/2001 | Fleming et al. | |
| 6,255,003 B1 | 7/2001 | Woodard et al. | |
| 6,268,695 B1 | 7/2001 | Affinito | |
| 6,480,250 B1 | 11/2002 | Matsufuji et al. | |
| 6,483,719 B1 | 11/2002 | Bachman | |
| 6,596,937 B2 | 7/2003 | Mazurkiewicz | |
| 6,621,003 B2 | 9/2003 | Yoshida et al. | |
| 2002/0042162 A1 | 4/2002 | Tone et al. | |
| 2002/0154406 A1 | 10/2002 | Merrill et al. | |
| 2002/0180324 A1 | 12/2002 | Yoshida et al. | |
| 2003/0077463 A1* | 4/2003 | Ishikawa | 428/458 |
| 2003/0085649 A1 | 5/2003 | Wachi et al. | |
| 2004/0032658 A1 | 2/2004 | Fleming | |
| 2004/0033369 A1 | 2/2004 | Fleming et al. | |
| 2004/0033675 A1 | 2/2004 | Fleming et al. | |

FOREIGN PATENT DOCUMENTS

| | | |
|---|---|---|
| EP | 0 944 299 A3 | 9/1999 |
| EP | 0 977 167 A1 | 2/2000 |
| WO | WO95/10117 | 4/1995 |
| WO | WO97/01440 | 1/1997 |
| WO | WO97/01778 | 1/1997 |
| WO | WO97/04885 | 2/1997 |
| WO | WO98/26927 | 6/1998 |
| WO | WO99/36248 | 7/1999 |
| WO | WO99/36262 | 7/1999 |
| WO | WO 00/26973 | 5/2000 |
| WO | WO 00/48749 | 8/2000 |
| WO | WO 01/31393 A1 | 5/2001 |
| WO | WO 01/58989 A1 | 8/2001 |
| WO | WO 01/96104 A2 | 12/2001 |
| WO | WO 01/96115 A1 | 12/2001 |

OTHER PUBLICATIONS

Presentation: Affinito et al., "Polymer-Oxide Transparent Barrier Layers," SVC 39th Annual Technical Conference, Paper No. W-12, (1996), pp. 1-6, no month.

Presentation: Shaw et al., "A New Vapor Deposition Process for Coating Paper and Polymer Webs," Sixth International Vacuum Web Coating Conference, Reno, NV, Oct. 28, 1992, pp. 18-24.

Presentation: Shaw et al., "A New High Speed Process for Vapor Depositing Acrylate Thin Films: An Update," Society of Vacuum Coaters 36th Annual Technical Conference (1993), pp. 348-352, no month.

Presentation: Shaw et al., "Use of Vapor Deposited Acrylate Coatings to Improve the Barrier Properties of Metallized Film," Society of Vacuum Coaters 37th Annual Technical Conference (1994), pp. 240-247, no month.

Presentation: Shaw et al., "Use of Evaporated Acrylated Coatings to Smooth the Surface of Polyester and Polypropylene Film Substrates," Rad Tech (1996), (12 pages), no month.

Article: Affinito et al., "Vacuum Deposited Polymer/Metal Multilayer Films for Optical Application," *Thin Solid Films*, vol. 270, (1995), pp. 43-48, no month.

Product Information: "Southwall™ Altair™ M Transparent Conductive Film," (date unknown but is prior to filing date of instant application), 1 page.

Product Information: "Shielded Windows," Advanced Performance Materials, (date unknown but is prior to filing date of instant application), 1 page.

Product Information: "EMI Shielding Products," Advanced Performance Materials, (date unknown but is prior to filing date of instant application), 2 pages.

Technological Information: "EMI Theory," Chomerics, (date unknown but is prior to filing date of instant application), pp. 1-3.

Technological Information: "Shielding Methods," Chomerics, (date unknown but is prior to filing date of instant application), pp. 1-7.

Product Information: "Display Products," Southwall Technologies, (date unknown but is prior to filing date of instant application), pp. 1-2.

Product Information: "BE 9 Shielded Windows," Advanced Performance Materials GMBH, (date unknown but is prior to filing date of instant application), pp. 60-67.

Book Excerpt: Austin, "Chapter 8: Electromagnetic Compatibility for Electrical Engineering," *Electrical Engineer's Reference Book*, Butterworth-Heinemann, Oxford, UK, Fifteenth Edition, (1993), pp. 8/3-8/14, no month.

Book: White and Mardiguian, "vol. 3: Electromagnetic Shielding," *A Handbook Series on Electromagnetic Interference and Compatibility*, Interference Control Technologies, Inc., Gainesville, Virginia, (1988), title page and table of contents, 12 pages, no month.

Book: Gnecco, *The Design of Shielded Enclosures: Cost-Effective Methods to Prevent EMI*, Butterworth-Heinemann, Boston, MA, (2000), title page, table of contents, List of Illustrations, and List of Tables, 13 pages, no month.

Book: White and Mardiguian, "vol. 8: EMI Control Methodology and Procedures," *A Handbook Series on Electromagnetic Interference and Compatibility*, Interference Control Technologies, Inc., Gainesville, Virginia, (1989), title page and table of contents, 11 pages, no month.

Article: Cairns et al., "Strain-Dependent Electrical Resistance of Tin-Doped Indium Oxide on Polymer Substrates," *Applied Physics Letters*, vol. 76, No. 11, Mar. 13, 2000, pp. 1425-1427.

H.G. Elias, "An Introduction to Plastics", VCH Verlagsgesellaschaft mbH (Weinheim, Germany), 1993 (no month), p. 249.

* cited by examiner

FLEXIBLE, FORMABLE CONDUCTIVE FILMS

CROSS REFERENCE TO RELATED APPLICATIONS

This application claims priority to U.S. application Ser. No. 10/222,465, "Durable Transparent EMI Shielding Film", filed Aug. 17, 2002, now U.S. Pat. No. 6,818,291 as a continuation-in-part.

FIELD OF THE INVENTION

This invention relates to electrically conductive films that can be flexed and deformed, and that are suitable for example in electromagnetic interference (EMI) shielding applications.

BACKGROUND

EMI shielding films block the transmission of unwanted electromagnetic energy into or out of electronic equipment. A variety of conductive materials can be used for this purpose. For applications in which it is necessary to see through the shielding (e.g., to view a display), windows containing fine wire mesh and specialized transparent films have been used. Transparent EMI shields are also described in U.S. Pat. Nos. 4,910,090 and 5,489,489 and in European Patent Application No. EP 810452. Commercially available transparent EMI shielding films typically employ a polymer substrate such as PET coated with a conductive oxide film (e.g., indium tin oxide) or with alternating coated layers of metal (e.g., silver) and conductive oxide. Representative commercially available transparent EMI shielding films include AgHT™-4 and AgHT™-8 films (CP Films, Inc.), ALTAIR™ M and XIR™ transparent conductive film (Southwall Technologies) and WIN-SHIELD™ AgF8 film (Chomerics Division of Parker Hannifin Corporation).

Current commercially available EMI shielding films lack adequate durability, contamination resistance or corrosion resistance. For example, the handling guidelines for film-based shields supplied by CP Films, Inc. recommend that workers wear non-dusted latex gloves and face masks when handling shielding films; caution that the conductive film coating is susceptible to attack by inorganic ions such as sodium, potassium and chloride, all of which are present on human fingers and in saliva; and recommend that if the film does become contaminated, its surface should be cleaned with a non-linting clean room wipe dampened in isopropyl alcohol. These handling guidelines also caution against excess rubbing when wiping the coating, since it is very thin and somewhat fragile.

SUMMARY OF THE INVENTION

The present invention provides, in one aspect, a conductive film comprising a flexible support, an extensible metal or metal alloy layer, and a crosslinked polymeric protective layer, wherein the film has at least one permanently deformed curved region.

In a second aspect, the invention provides a self-supporting curved article comprising a thermoplastic polymeric support having first and second metal or metal alloy layers separated by a polymeric spacing layer, wherein the thickness of the spacing layer is generally lower at regions of the article that have experienced high levels of strain and generally higher at regions of the article that have experienced little or no strain. The disclosed conductive films and formed articles maintain adequate conductivity over a wide range of stresses and strains experienced in the forming processes.

The disclosed articles that are formed by molding, embossing, thermoforming, bending, or the like can be simply curved and/or compound curved, i.e., curved in two different, non-linear directions from a single point. Furthermore, in some embodiments the electrically conductive films are light-transmissive.

In a third aspect, the invention provides a method for forming an article comprising:
a) providing a preform comprising a thermoplastic support having a metal or metal alloy layer and a crosslinked polymeric protective layer;
b) molding, embossing, thermoforming or otherwise deforming the preform to provide a self-supporting article having at least one permanently deformed curved region.

The disclosed films and articles can have increased resistance to delamination, fracture or corrosion when formed or when subjected to bending, flexing, stretching, deforming operations or corrosive conditions, yet still maintain adequate electrical conductivity, and hence good EMI shielding performance. Preferably, the metal or metal alloy layers are substantially continuous over substantial areas of the film, i.e., over portions of the film where EMI shielding, heating, or like functionality is desired. In some embodiments, the metal or metal alloy layers can be completely continuous over the entire film; in other embodiments the metal or metal alloy layers can be patterned to define a limited number of apertures, holes, or channels for desired functionality (e.g. to provide one or more frequency selective surfaces or distinct, electrically conductive pathways).

These and other aspects of the invention will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWING

Like reference symbols in the various figures of the drawing indicate like elements. The elements in the drawing are not to scale.

DETAILED DESCRIPTION

Figure 1:
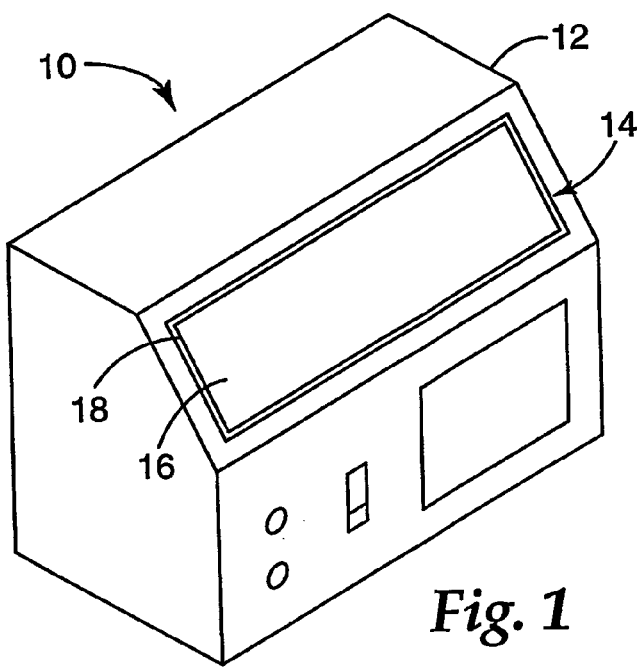
FIG. 1 is a schematic perspective view of a disclosed electromagnetically shielded article.

By using words of orientation such as "atop", "on", "uppermost" and the like for the location of various layers in the disclosed films or articles, we refer to the relative position of one or more layers with respect to a horizontal support layer. We do not intend that the films or articles should have any particular orientation in space during or after their manufacture.

By a "light-transmissive" support, layer, film or article, we mean that the support, layer, film or article has an average transmission, T, in a spectral range of interest of at least about 20%, measured along the normal axis. By a "visible light-transmissive" support, layer, film or article, we mean that the support, layer, film or article has a transmission, $T_{vis}$, in the visible portion of the spectrum, of at least about 20%, measured along the normal axis. By an "infrared-reflective" support, layer, film or article, we mean that the support, layer, film or article reflects at least about 50% of light in a band at least 100 nm wide in a wavelength region from about 700 nm to about 2000 nm, measured at a near-normal angle (e.g., at about a 6° angle of incidence). By "light" we mean solar radiation.

By a "flexible" support, layer, film or article, we mean that the support, layer, film or article can be bent 30° from its original position (without requiring folding or creasing) and released to recover at least part of its original shape without loss of electrical continuity and without forming visible discontinuities as detected by the naked eye at a distance of about 0.25 meters.

By a "metal layer" we mean a metal or metal alloy layer.

By an "extensible" metal layer we refer to a layer that when incorporated into a light-transmissive film or article can be stretched by at least 3% in an in-plane direction without loss of electrical continuity and without forming visible discontinuities in the surface of the metal layer as detected by the naked eye at a distance of about 0.25 meters.

By a "crosslinked" polymer, we mean a polymer in which polymer chains are joined together by covalent chemical bonds, usually via crosslinking molecules or groups, to form a network polymer. A crosslinked polymer is generally characterized by insolubility, but may be swellable in the presence of an appropriate solvent. The term "polymer" includes homopolymers and copolymers, as well as homopolymers or copolymers that may be formed in a miscible blend, e.g., by coextrusion or by reaction, including, e.g., transesterification. The term "copolymer" includes both random and block copolymers.

By a "non-planar" support, layer, film or article, we mean that the support, layer, film or article has a continuous, intermittent, unidirectional or compound curvature. By a support, layer, film or article that is "compound curved" or has "compound curvature", we mean that a surface of the support, layer, film or article curves in two different, non-linear directions from a single point.

By a "self-supporting" compound curved support, layer, film or article, we mean that the support, layer, film or article has sufficient rigidity to substantially maintain its shape when placed on a horizontal surface and when held by hand at one end and allowed to hang vertically.

By a "permanently deformed compound curved region" of a support, layer, film or article, we mean that a surface of the support, layer, film or article includes a non-planar region having compound curvature whose shape substantially persists when the support, layer, film or article is held taut by hand at two opposing ends so that apparent slackness is removed.

By "optically clear" we refer to a film or article in which there is an absence of visibly noticeable haze or flaws as detected by the naked eye at a distance of about 1 meter, preferably about 0.5 meters.

Referring to FIG. 1, medical device 10 is partially shielded from EMI by metal housing 12. Information display 14 on housing 12 is covered with a transparent EMI shielding film 16. Metallic bezel 18 surrounds film 16 and serves as a grounding electrode that electrically connects the entire perimeter of film 16 to housing 12. Film 16 provides EMI shielding for the remainder of device 10 not already shielded by housing 12.

Figure 2:
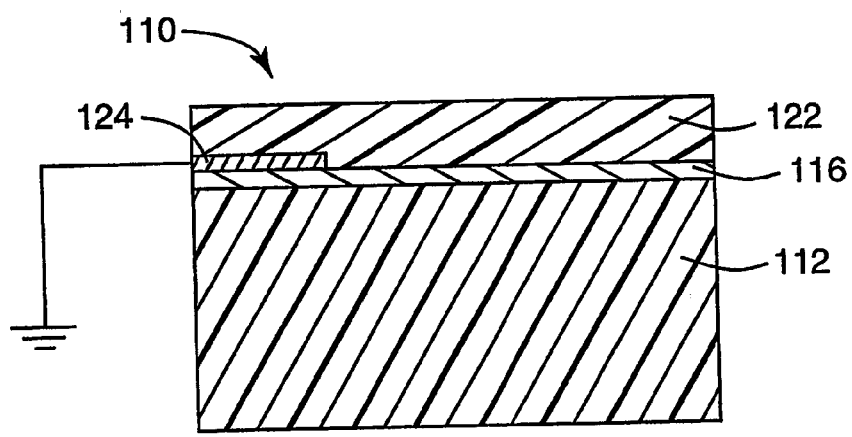
FIG. 2 through FIG. 5 are schematic cross-sectional views of disclosed films.

Referring to FIG. 2, a film usable as an EMI shield is shown generally at 110. Film 110 includes flexible support 112 made of a visible light-transparent plastic film such as polyethylene terephthalate ("PET"). Extensible visible light-transparent metal layer 116 made of silver lies atop support 112. Protective layer 122 made of a crosslinked acrylate polymer lies atop metal layer 116. Metal layer 116 is grounded via electrode 124.

Figure 3:
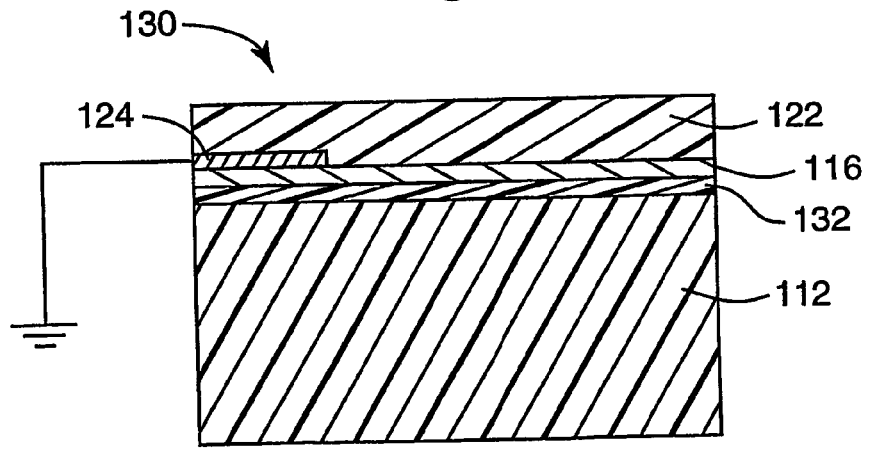

In FIG. 3, another film usable as an EMI shield is shown generally at 130. Film 130 resembles film 110, but includes a base coat layer 132 made from crosslinked acrylate polymer between support 112 and metal layer 116.

Figure 4:
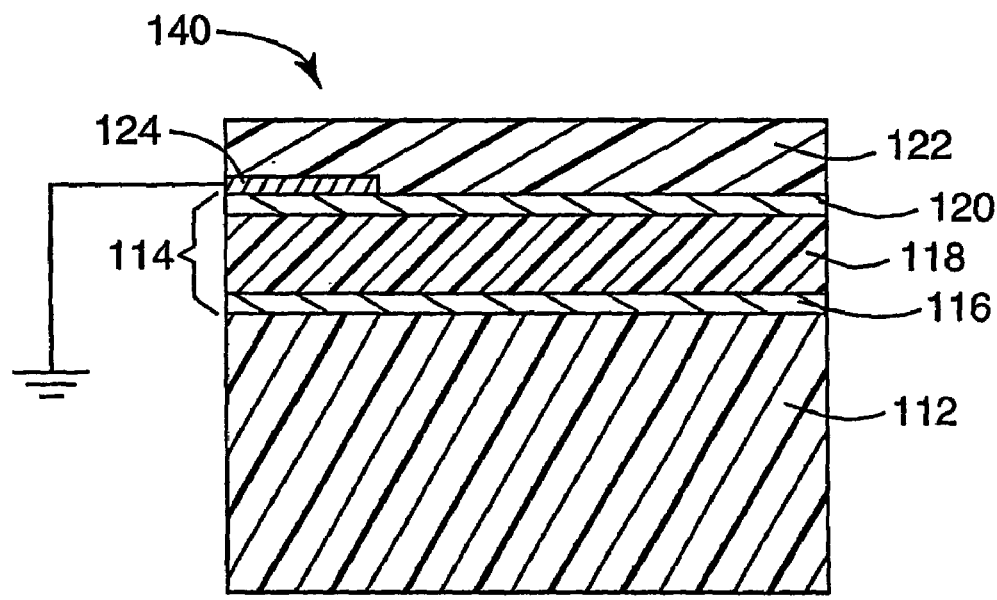

In FIG. 4, a film usable as an EMI shield is shown generally at 140. Film 140 resembles film 110, but includes Fabry-Perot interference stack 114 atop support 112. Stack 114 includes first visible light-transparent metal layer 116, a visible light-transparent spacing layer 118 made of a crosslinked acrylate polymer and second visible light-transparent metal layer 120 made of silver. The thicknesses of the metal layers 116 and 120 and the intervening crosslinked polymeric layer 118 are carefully chosen so that metal layers 116 and 120 are partially reflective and partially transmissive. Spacing layer 118 has an optical thickness (defined as the physical thickness of layer times its in-plane index of refraction) to achieve the center of the desired pass band for transmitted light. Light whose wavelength is within the pass band is mainly transmitted through the thin metal layers 116 and 120. Light whose wavelength is above the pass band is mainly reflected by the thin metal layers 116 and 120 or canceled due to destructive interference. Spacing layer 118 also serves as a protective layer for first metal layer 116.

Figure 5:
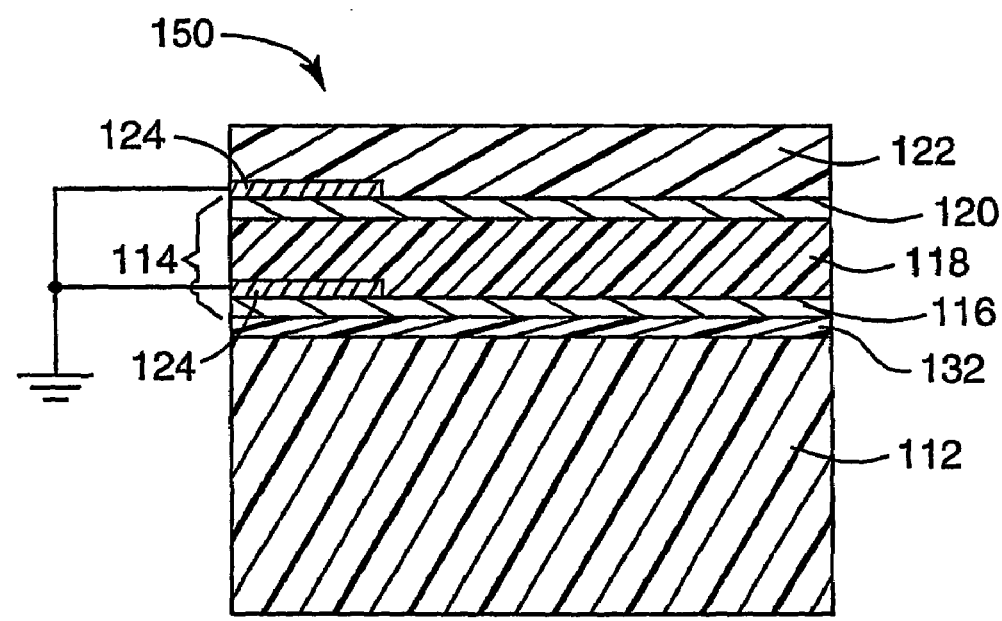

In FIG. 5, another disclosed film is shown generally at 150. Film 150 resembles film 140, but includes base coat layer 132 between support 112 and metal layer 116, and a second grounded electrode 124.

A variety of visible light-transparent supports can be employed. Preferred supports have a visible light transmission of at least about 70% at 550 nm. Particularly preferred supports are flexible plastic materials including thermoplastic films such as polyesters (e.g., PET), polyacrylates (e.g., polymethyl methacrylate), polycarbonates, polypropylenes, high or low density polyethylenes, polyethylene naphthalates, polysulfones, polyether sulfones, polyurethanes, polyamides, polyvinyl butyral, polyvinyl chloride, polyvinylidene difluoride and polyethylene sulfide; and thermoset films such as cellulose derivatives, polyimide, polyimide benzoxazole and poly benzoxazole. The support can also be a multilayer optical film ("MOF") such as those described in U.S. Patent Application Publication No. U.S. 2002/0154406 A1, or a MOF coated with at least one crosslinked polymeric layer and metal layer such as those described in copending application Ser. No. 10/222,473, filed Aug. 17, 2002 and entitled "ENHANCED HEAT MIRROR FILMS", incorporated herein by reference. Supports made of PET and MOF are especially preferred. Preferably the support has a thickness of about 0.01 to about 1 mm. The support may however be considerably thicker, for example when a self-supporting article is desired. Such articles can conveniently also be made by forming one or more metal layers and one or more cross-linked polymeric layers of atop a flexible support, and laminating or otherwise joining the flexible support to a thicker, inflexible or less flexible supplemental support as described in more detail below.

The metal layer 116 can be made from a variety of materials. Preferred metals include elemental silver, gold, copper, nickel and chrome, with silver being especially preferred. Alloys such as stainless steel or dispersions containing these metals in admixture with one another or with other metals also can be employed. When additional metal layers are employed, they can be the same as or different from one another, and need not have the same thickness. Preferably the metal layer or layers are sufficiently thick so as to remain continuous if elongated by more than 3% in an in-plane direction, and sufficiently thin so as to ensure that the film and articles employing the film will have the desired degree of EMI shielding and light transmission. Preferably the physical thickness (as opposed to the optical thickness) of the metal layer or layers is about 3 to about 50 nm, more preferably about 4 to about 15 nm. Typically the metal layer or layers are formed by deposition on the above-mentioned support using techniques employed in the film metallizing art such as sputtering (e.g., cathode or planar magnetron sputtering), evaporation (e.g., resistive or electron beam evaporation), chemical vapor deposition, plating and the like.

The smoothness and continuity of the first metal layer and its adhesion to the support preferably are enhanced by appropriate pretreatment of the support. A preferred pretreatment regimen involves electrical discharge pretreatment of the support in the presence of a reactive or non-reactive atmosphere (e.g., plasma, glow discharge, corona discharge, dielectric barrier discharge or atmospheric pressure discharge); chemical pretreatment; flame pretreatment; or application of a nucleating layer such as the oxides and alloys described in U.S. Pat. Nos. 3,601,471 and 3,682,528. These pretreatments may help ensure that the surface of the support will be receptive to the subsequently applied metal layer. Plasma pretreatment is particularly preferred. A further particularly preferred pretreatment regimen involves coating the support with an inorganic or organic base coat layer such as layer 132 above, optionally followed by further pretreatment using plasma or one of the other pretreatments described above. Organic base coat layers, and especially base coat layers based on crosslinked acrylate polymers, are especially preferred. Most preferably, the base coat layer is formed by flash evaporation and vapor deposition of one or more radiation-crosslinkable monomers (e.g., acrylate monomers, optionally combined with a suitable photoinitiator), followed by crosslinking in situ (using, for example, an electron beam apparatus, UV light source, electrical discharge apparatus or other suitable device), as described in U.S. Pat. Nos. 4,696,719, 4,722,515, 4,842,893, 4,954,371, 5,018,048, 5,032,461, 5,097,800, 5,125,138, 5,440,446, 5,547,508, 6,045,864, 6,231,939 and 6,214,422; in published PCT Application No. WO 00/26973; in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996). If desired, the base coat can also be applied using conventional coating methods such as roll coating (e.g., gravure roll coating) or spray coating (e.g., electrostatic spray coating), then crosslinked using, for example, UV radiation. The desired chemical composition and thickness of the base coat layer will depend in part on the nature of the support. For example, for a PET support, the base coat layer preferably is formed from an acrylate monomer and typically will have a thickness of only a few nanometers up to about 2 micrometers.

The adhesion of the first metal layer to a base coat layer can be further improved by including an adhesion-promoting or anticorrosion additive in the base coat layer. This may affect the surface energy or other relevant characteristics of the interface between the base coat layer and the first metal layer. Suitable adhesion-promoting or anticorrosion additives include mercaptans, thiol-containing compounds, acids (such as carboxylic acids or organic phosphoric acids), triazoles, dyes and wetting agents. Ethylene glycol bis-thioglycolate (described in U.S. Pat. No. 4,645,714) is a particularly preferred additive. The additive preferably is present in amounts sufficient to obtain the desired degree of increased adhesion, without causing undue oxidation or other degradation of the first metal layer.

A crosslinked polymeric layer lies atop the first metal layer, and serves as a protective corrosion-resistant topcoat 122 if no other metal layers are present and as a protective layer and spacing layer such as layer 118 if additional metal layers are employed. Stacks containing 2, 3 or 4 metal layers provide desirable characteristics for some applications. Stacks containing 2 to 4 metal layers in which each of the metal layers has a crosslinked polymeric layer adjacent to each of its faces are especially preferred. Exemplary films containing Fabry-Perot optical interference stacks are described in copending application Ser. No. 10/222,466, filed Aug. 17, 2002 and entitled "POLYMER-METAL INFRARED INTERFERENCE FILTER", incorporated herein by reference, and in the above mentioned copending application Ser. No. 10/222,473. Use of a crosslinked polymeric spacing layer between metal layers renders the film and its metal layers more readily extensible while reducing damage to the metal layers.

The crosslinked polymeric layer can be formed from a variety of organic materials. Preferably the polymeric layer is crosslinked in situ atop the first metal layer. If desired, the polymeric layer can be applied using conventional coating methods such as roll coating (e.g., gravure roll coating) or spray coating (e.g., electrostatic spray coating), then crosslinked using, for example, UV radiation. Most preferably the polymeric layer is formed by flash evaporation, vapor deposition and crosslinking of a monomer as described above for base coat layer 132. Volatilizable (meth) acrylate monomers are preferred for use in such a process, with volatilizable acrylate monomers being especially preferred. Preferred (meth)acrylates have a molecular weight in the range of about 150 to about 600, more preferably about 200 to about 400. Other preferred (meth)acrylates have a value of the ratio of the molecular weight to the number of acrylate functional groups per molecule in the range of about 150 to about 600 g/mole/(meth)acrylate group, more preferably about 200 to about 400 g/mole/(meth)acrylate group. Fluorinated (meth)acrylates can be used at higher molecular weight ranges or ratios, e.g., about 400 to about 3000 molecular weight or about 400 to about 3000 g/mole/(meth) acrylate group. Coating efficiency can be improved by cooling the support. Particularly preferred monomers include multifunctional(meth)acrylates, used alone or in combination with other multifunctional or monofunctional (meth)acrylates, such as hexanediol diacrylate, ethoxyethyl acrylate, phenoxyethyl acrylate, cyanoethyl(mono)acrylate, isobornyl acrylate, isobornyl methacrylate, octadecyl acrylate, isodecyl acrylate, lauryl acrylate, beta-carboxyethyl acrylate, tetrahydrofurfuryl acrylate, dinitrile acrylate, pentafluorophenyl acrylate, nitrophenyl acrylate, 2-phenoxyethyl acrylate, 2-phenoxyethyl methacrylate, 2,2,2-trifluoromethyl(meth)acrylate, diethylene glycol diacrylate, triethylene glycol diacrylate, triethylene glycol dimethacrylate, tripropylene glycol diacrylate, tetraethylene glycol diacrylate, neopentyl glycol diacrylate, propoxylated neopentyl glycol diacrylate, polyethylene glycol diacrylate, tetraethylene glycol diacrylate, bisphenol A epoxy diacrylate, 1,6-hexanediol dimethacrylate, trimethylol propane triacrylate, ethoxylated trimethylol propane triacrylate, propylated trimethylol propane triacrylate, tris(2-hydroxyethyl)-isocyanurate triacrylate, pentaerythritol triacrylate, phenylthioethyl acrylate, naphthloxyethyl acrylate, IRR-214 cyclic diacrylate from UCB Chemicals, epoxy acrylate RDX80095 from Rad-Cure Corporation, and mixtures thereof. A variety of other curable materials can be included in the crosslinked polymeric layer, e.g., vinyl ethers, vinyl naphthylene, acrylonitrile, and mixtures thereof. The physical thickness of the crosslinked polymeric layer will depend in part upon its refractive index and in part upon the desired optical characteristics of the film (e.g., on whether the film contains additional metal layers). For use in an infrared-rejecting EMI shielding film containing a Fabry-Perot stack, the crosslinked polymeric layer typically will have a refractive index of about 1.3 to about 1.7, and preferably will have an optical thickness of about 75 to about 350 mm, more preferably about 100 to about 275 nm and a corresponding physical thickness of about 45 to about 270 nm, more preferably about 60 to about 210 nm.

The smoothness and continuity of the crosslinked polymeric layer and its adhesion to the first metal layer preferably are enhanced by appropriate pretreatment of the first metal layer prior to application of the crosslinked polymeric layer, or by inclusion of a suitable additive in the crosslinked polymeric layer. Preferred pretreatments include the support pretreatments described above, with plasma pretreatment of the first metal layer being particularly preferred. Preferred additives for the crosslinked polymeric layer include the base coat layer additives described above.

The smoothness and continuity of any additionally applied metal layers and their adhesion to an underlying crosslinked polymeric layer preferably are enhanced by appropriate pretreatment of the crosslinked polymeric layer prior to application of the additionally applied metal layer, or by inclusion of a suitable additive in the crosslinked polymeric layer. Preferred pretreatments include the support pretreatments described above, with plasma pretreatment of the crosslinked polymeric layer being particularly preferred. Preferred additives for the crosslinked polymeric layer include the base coat layer additives described above.

Surprisingly, we have also discovered that when one or both of the above-described pretreatments is employed, and when one or more of the above-described base coat layer additives is incorporated into the monomer mixture used for forming the spacing layer(s), the resistance of the metal layer(s) to corrosion under the influence of an electrical current is markedly enhanced. Plasma treatment is a preferred pretreatment, with a nitrogen plasma being especially preferred. Ethylene glycol bis-thioglycolate is a preferred additive for incorporation into the monomer mixture.

Various functional layers or coatings can be added to the EMI shielding film to alter or improve its physical or chemical properties, particularly at the surface of the film. Such layers or coatings can include, for example, low friction coatings or slip particles to make the film easier to handle during film manufacturing; particles to add diffusion properties to the film or to prevent wet-out or Newton's rings when the film is placed next to another film or surface; antireflection layers to prevent glare when the EMI shielding film is applied to the face of an information display; antistatic coatings; abrasion resistant or hardcoat materials; anti-fogging materials; magnetic or magneto-optic coatings or films; adhesives such as pressure sensitive adhesives or hot melt adhesives; primers to promote adhesion to adjacent layers; low adhesion backsize materials for use when the film is to be used in adhesive roll form; liquid crystal panels; electrochromic or electroluminescent panels; photographic emulsions; prismatic films and holographic films or images. Additional functional layers or coatings are described, for example, in published PCT Application Nos. WO 97/01440, WO 99/36262, and WO 99/36248. The functional layers or coatings can also include shatter resistant, anti-intrusion, or puncture-tear resistant films and coatings, for example, the functional layers described in published PCT Application No. WO 01/96115. Additional functional layers or coatings can include vibration-damping film layers such as those described in published PCT Application No. WO 98/26927 and U.S. Pat. No. 5,773,102, and barrier layers to provide protection or to alter the transmissive properties of the film towards liquids such as water or organic solvents or towards gases such as oxygen, water vapor or carbon dioxide. These functional components can be incorporated into one or more of the outermost layers of the EMI shielding film, or they can be applied as a separate film or coating or included in a supplemental support.

For some applications, it may be desirable to alter the appearance or performance of the EMI shielding film, such as by laminating a dyed film layer to the film, applying a pigmented coating to the surface of the film, or including a dye or pigment in one or more of the materials used to make the film. The dye or pigment can absorb in one or more selected regions of the spectrum, including portions of the infrared, ultraviolet or visible spectrum. The dye or pigment can be used to complement the properties of the film, particularly where the film transmits some frequencies while reflecting others. A particularly useful pigmented layer that can be employed in the EMI shielding films is described in published PCT Application No. WO 2001/58989. This layer can be laminated, extrusion coated or coextruded as a skin layer on the film. The pigment loading level can be varied between about 0.01 and about 1.0% by weight to vary the visible light transmission as desired. The addition of a UV absorptive cover layer can also be desirable in order to protect any inner layers of the film that may be unstable when exposed to UV radiation. The EMI shielding film can also be treated with, for example, inks or other printed indicia such as those used to display product identification, orientation information, advertisements, warnings, decoration, or other information. Various techniques can be used to print on the EMI shielding film, such as, for example, screen printing, inkjet printing, thermal transfer printing, letterpress printing, offset printing, flexographic printing, stipple printing, laser printing, and so forth, and various types of ink can be used, including one and two component inks, oxidatively drying and UV-drying inks, dissolved inks, dispersed inks, and 100% ink systems.

The EMI shielding films can be oriented and optionally heat set under conditions sufficient to assist the film in conforming without substantial wrinkling to a non-planar substrate. This is especially useful when a non-planar substrate to which an EMI shielding film is to be laminated has a known shape or curvature, and especially when the laminate has a known severe compound curvature. By individually controlling the shrinkage of the EMI shielding film or substrate in each in-plane direction, the EMI shielding film can be caused to shrink in a controlled fashion during lamination, especially during nip roll lamination. Further details regarding techniques for manufacturing MOF supports having targeted shrinkage properties are described in published PCT Application No. WO 01/96104.

Figure 6A:
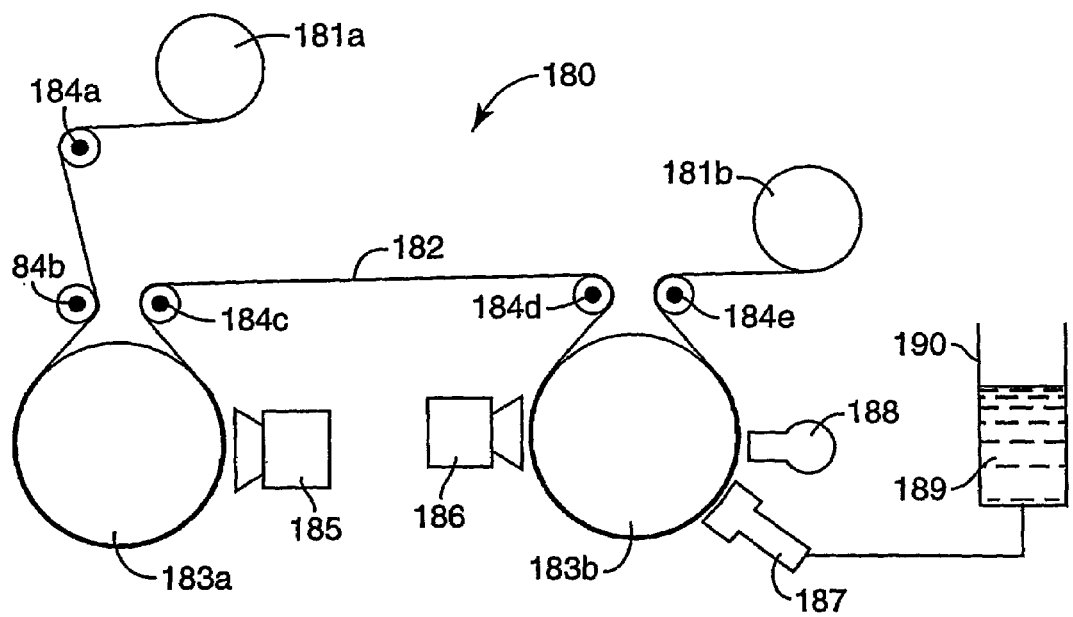
FIG. 6A is a schematic view of an apparatus for manufacturing the disclosed films.

An apparatus 180 that can conveniently be used to manufacture the disclosed films is shown in FIG. 6A. Powered reels 181a and 181b move supporting web 182 back and forth through apparatus 180. Temperature-controlled rotating drums 183a and 183b, and idlers 184a, 184b, 184c, 184d and 184e carry web 182 past metal sputtering applicator 185, plasma pretreater 186, monomer evaporator 187 and E-beam crosslinking apparatus 188. Liquid monomer 189 is supplied to evaporator 187 from reservoir 190. Successive layers can be applied to web 182 using multiple passes through apparatus 180. Apparatus 180 can be enclosed in a suitable chamber (not shown in FIG. 6A) and maintained under vacuum or supplied with a suitable inert atmosphere in order to discourage oxygen, water vapor, dust and other atmospheric contaminants from interfering with the various pretreatment, monomer coating, crosslinking and sputtering steps.

The metal layer or layers of the EMI shielding film preferably are connected to at least one grounding electrode such as electrode 124 in FIG. 2. The grounding electrode(s) can be connected to the metal layer(s) before or after the EMI shielding film is joined to other materials or to a device requiring EMI shielding. Grounding electrodes can be formed using masking, plating and other printed circuitry techniques that will be familiar to those skilled in the art, or formed using metallic strips, wires, conductive paints and other connections that will likewise be familiar to those skilled in the art. 3M™ Conductive Tapes 9703 and 9713 (3M, St. Paul Minn.) are particularly preferred grounding electrodes. These tapes contain fibers or particles that penetrate the outermost crosslinked polymer layer and provide an electrical connection to the underlying metal layer. Appropriate busbars can be employed with such tapes when two or more metal layers are to be connected in series or in parallel.

In another embodiment, the metal layer need not be grounded. Although less preferred, such an embodiment does provide EMI shielding via reflection, and can be used for applications where lower levels of EMI shielding can be tolerated. Applications for such ungrounded EMI shielding films include testing facilities, security/secure rooms and antennae components.

In an EMI shielded article, preferably the majority and most preferably the entire EMI shielding film perimeter is connected to the grounding electrode(s). The grounding electrode(s) normally are connected or bonded to the device requiring EMI shielding or to a housing (e.g., a nontransparent housing) surrounding the device.

When the EMI shielding film contains multiple metal layers, one or more of the layers can be used for EMI shielding and one or more of the remaining layers can be used for a purpose other than EMI shielding, e.g., for heating, intrusion detection, touch detection infrared rejection and decorative or other optical purposes. Heating films containing multiple metal layers are described in copending application Serial Number No. 10/222,449, filed Aug. 17, 2002 and entitled "FLEXIBLE ELECTRICALLY CONDUCTIVE FILM", incorporated herein by reference. The EMI shielding films can also be used for purposes where EMI shielding is not required, e.g., for heating, intrusion detection, touch detection, infrared rejection and decorative or other optical purposes without a deliberate EMI shielding role. Thus other uses for the EMI shielding films and articles include electrically heated articles, electrode-containing articles, barrier articles, security articles, decorative articles and license plates.

The EMI shielding films and articles can be flexible or self-supporting. Fabrication of a self-supporting article can be made easier by laminating or otherwise joining the film to a suitable supplemental support or other substrate. Typical supplemental support or substrate materials include glazing materials such as glass (which may be insulated, tempered, laminated, annealed, or heat strengthened, and in forms including sheets and molded articles), metals (which may be laminated, annealed, or heat strengthened, and in forms including continuous or perforated sheets, mesh, slabs and molded articles) and plastics (which may be laminated, annealed or heat treated, and in forms including continuous or perforated sheets, woven or nonwoven mesh, slabs and molded articles). The EMI shielding films are especially useful in non-planar configurations or in connection with non-planar substrates, especially those having a compound curvature, including non-planar panels or molded articles made of glass, metal, plastic materials such as the support materials recited above and other suitable materials. Such non-planar configurations can often be obtained through deliberate deformation of the EMI shielding film. For brevity, the word "preform" can be used to describe EMI shielding films or articles embodying the EMI shielding film that are intended to be subjected to a deforming operation. The deforming operation may for example alter at least one surface of the preform from the uniformly smooth, planar-surfaces the EMI shielding film typically has when initially fabricated. The deforming operation typically converts a generally smooth, planar-surfaced region of the preform to a region having three-dimensional characteristics. The deforming operation can employ heat to improve the working qualities of the preform and other measures such as pressure, vacuum, molds, etc. For example, one preferred deformation operation employs thermoforming, including the various forms of vacuum or pressure molding/forming, plug molding, injection molding, etc. The preform can be adhered to, stretched or otherwise deformed over a non-planar substrate (e.g., a compound curved substrate). The preform can be embossed or otherwise deliberately reshaped. Drawing or stretching of the preform may also be employed to impart a permanently deformed compound curved region to the preform. Those skilled in the art will appreciate that a variety of other fabrication techniques can be used to impart intentional deformation to the preform.

Figure 6B:
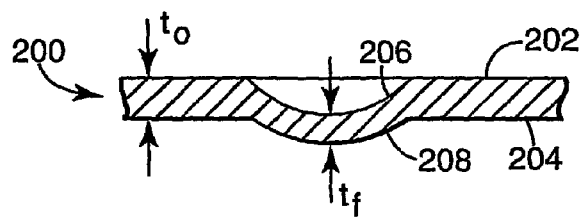
FIG. 6B is an enlarged partial cross-sectional view of a disclosed compound-curved article.

The deformation can include relatively small deformations such as those experienced when embossing the film, up to larger scale deformations such as those experienced when molding or thermoforming the film. The preform preferably is capable of adopting a non-planar configuration without substantial cracking or creasing. The thus-deformed film or article can have a variety of configurations. One such configuration is depicted in FIG. 6B, where preform 200 includes a first major surface 202 and a second major surface 204 deformed in selected regions 206 and 208. Selected region 206 is a depression in first major surface 202 and selected region 208 is a raised area in second major surface 208, and in this instance these two regions coincide. The generally smooth, planar portions of preform 200 surrounding regions 206 and 208 define an undeformed thickness $t_o$. The selected regions 206 and 208 define a deformed thickness $t_1$. In some instances it may be desirable that the ratio $t_o:t_1$ be at least about 1.1:1, more preferably at least about 1.5:1, yet more preferably at least about 1.75:1, and even more preferably at least about 2:1.

Figure 6C:
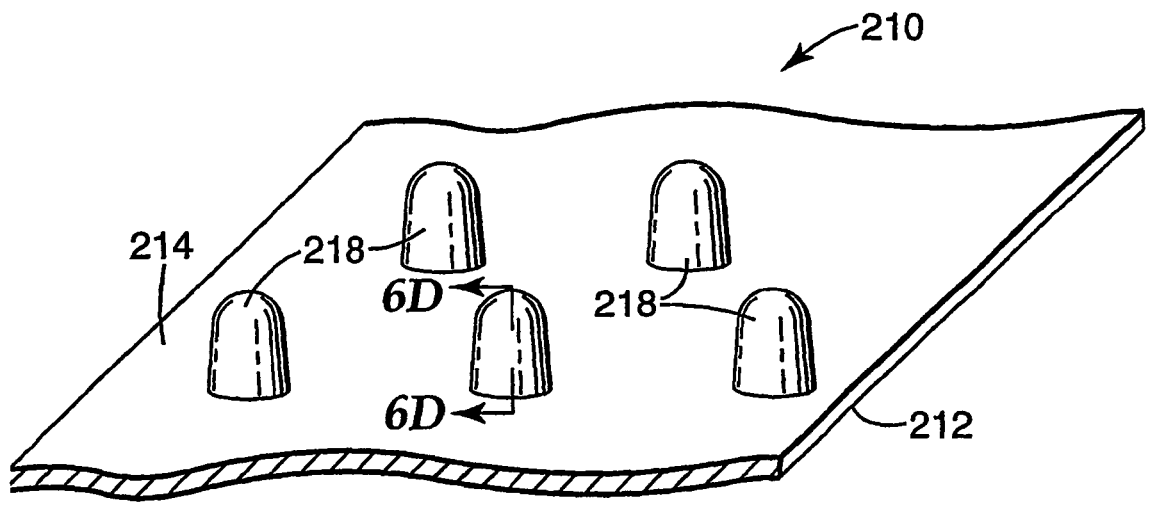
FIG. 6C is a perspective view of a portion of a disclosed compound-curved article.
Figure 6D:
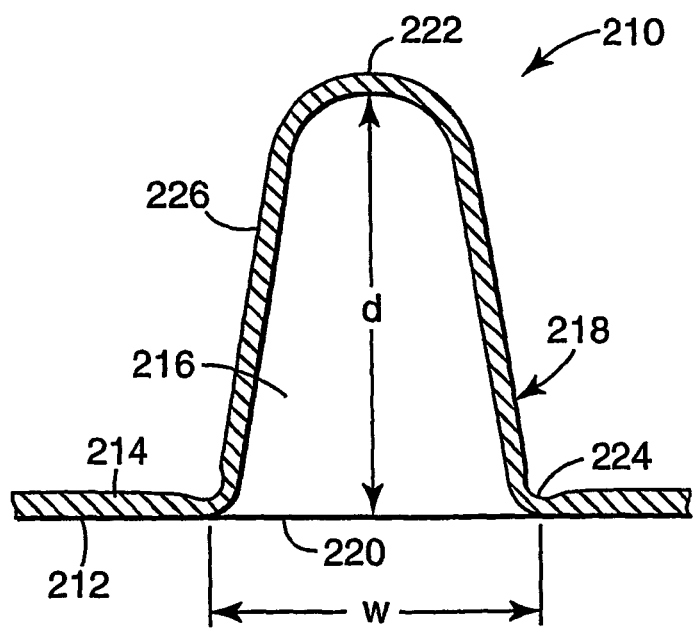
FIG. 6D and FIG. 6E are enlarged partial cross-sectional views of disclosed compound-curved articles.

FIG. 6C and FIG. 6D illustrate a more extreme deformation outcome. Article 210 can be considered an example of a deep draw deformation operation. Article 210 includes a first major surface 212 and a second major surface 214 along with a plurality of selected areas in which the preform has been deformed to provide depressed areas 216 and openings 220 formed in the first major surface 212 and raised areas 218 formed on the second major surface 214. The depressed areas 216 include openings 220, curved regions 222 and 224 having successively lower radii of curvature, and deeply drawn sidewalls 226. The deformation can be characterized by the aspect ratio of the average width w of the depressed areas 216 (as measured across opening 220) to the average depth d of the depressed areas 216 (as measured from the first major surface 212). For a noncircular opening 220 it is preferred that the width w be measured across its narrowest dimension. In some instances it may be preferable that the depressed areas 216 have an aspect ratio w:d of about 10:1 or less, more preferably 2:1 or less, even more preferably about 1:1 or less, and still more preferably about 0.5:1 or less. The extent of deformation can if desired be measured in absolute terms. For some instances it may be preferred that the depth d be at least about 0.1 millimeter or more, more preferably at least about 1 millimeter or more, and even more preferably at least about 10 millimeters or more. It will be understood that where the depth d approaches or exceeds the thickness of the preform, it becomes more likely that a raised area 218 will be formed on the second major surface 214.

Figure 6E:
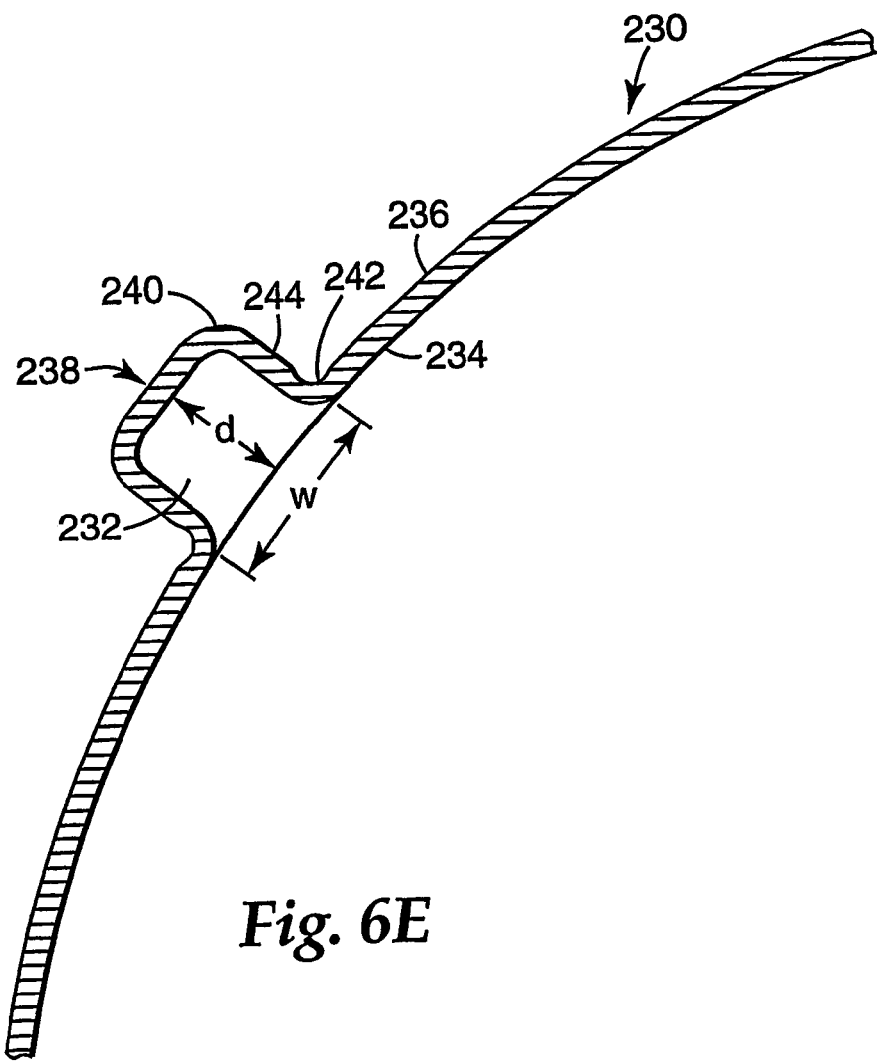

Measurement of the depth d of the depressed areas 216 formed in the first major surface 212 is not limited to those instances in which the first major surface is planar. Turning now to FIG. 6E, a deformed preform 230 is depicted in a curved configuration. Preform 230 includes a depressed area 232 formed on the first major surface 234, a corresponding raised area 238 on the second major surface 236, areas of low radius of curvature 240 and 242 and deeply drawn sidewalls 244. The depth d of depressed area 232 will preferably be measured from the geometric surface defined generally by the first major surface 234 and will typically be the largest depth from that geometric surface.

If the EMI shielding film includes a polymeric spacing layer between first and second metal layers, the spacing layer may undergo a reduction in thickness due to the deformation operation. In such instances the polymeric spacing layer thickness may be generally lower at regions of the article that have experienced a high level of strain in the deformation process and generally higher at regions of the article that have experienced little or no strain during the deformation process Although not wishing to be bound by theory, it is believed that articles formed by the disclosed processes undergo changes that are reflected in the structures resulting from the process. A planar film comprising a thermoplastic substrate, at least one metal or metal alloy layer, and at least one crosslinked polymeric layer is deformed by the described processes of embossing, extending, or thermoforming or the like to conform to a bent, curved, or compound curved shape. As a result of this process, the metal or metal alloy layer may be elongated in some regions and may be compressed in other regions. A material property that is commonly measured is the elongation to break, which represents the amount that a material can be stretched (measured by strain) before the material undergoes cohesive failure (i.e. breakage). The determination of whether a layer is compressed or elongated during the deformation process can be described by the spatial relation of the layer to the neutral plane of the original planar film, as described in U.S. Pat. No. 4,888,061. Preferably, the metal or metal alloy layers are located near the neutral plane of the film. Material located on the neutral plane of the film is not subjected to stress as a result of deformation, and no strain of the film results. Depending on the relative orientation of the deformation, a material layer located above or below the neutral plane will either undergo compression or elongation. For example, the preform planar film described above, will generally have a neutral plane within the substrate, and the metal or metal alloy layer, and the associated transparent crosslinked polymer layer, will be located a distance from this neutral plane. When the planar film is deformed such that the metal containing layer is between the neutral plane and the outside edge of a radius of curvature, the metal containing layer is elongated; conversely, when the metal containing layer is between the neutral plane and the inside edge of a radius of curvature, the metal containing layer is compressed. In a like manner, the relative thickness of each of the layers in the planar film may be changed relative to the original thickness, depending on whether the layers are formed under compression or tension (which causes elongation). The elongation to break of the metal containing layer is dependent upon whether the layer has been compressed or elongated. Compared to the elongation to break of the original planar film, a metal containing layer which has been elongated during the deformation process will have a lower elongation to break (i.e. the layer can withstand much less stress before cohesive failure); additionally, the thickness of each of the layers in the film can be reduced during this deformation. In contrast, a metal-containing layer which has been compressed, has a higher elongation to break than the planar film; additionally, the thickness of each of the layers in the film can be increased during this deformation.

Figure 6F:
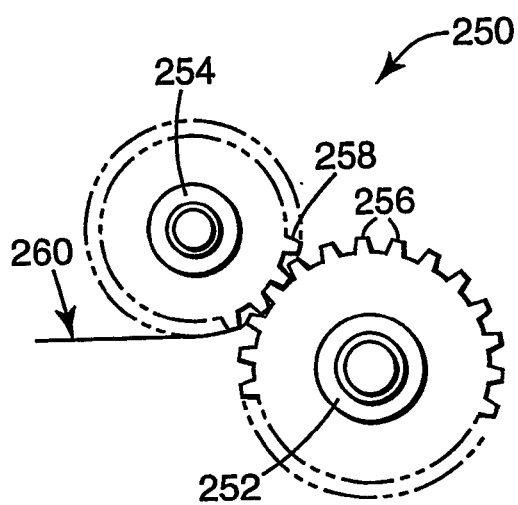
FIG. 6F is a partial schematic diagram of a corrugating apparatus that can be used to prepare curved articles.

FIG. 6F shows a partial view of a device 250 for corrugating a preform using first and second generally cylindrical corrugating members or rollers 252 and 254 each having an axis and a multiplicity of spaced ridges 256 and 258 respectively defining the periphery of corrugating members 252 and 254. The spaces between ridges 256 and 258 are adapted to receive the preform 260 in meshing relationship between corrugating members 252 and 254. The arrangement also includes appropriate devices for rotating at least one of the corrugating members 252 or 254 and for feeding or taking up the preform 260 so that the preform 260 will be generally deformed to the shape defined by the periphery of the first corrugating member 252. Process parameters that influence the three-dimensional configuration and in some instances the decorative appearance of the resulting corrugated films include the temperatures of the corrugating rollers, the nip pressure between the corrugating rollers, the diameter of the corrugating rollers, the line speed, and the shape and spading of the ridges 256 and 258.

Figure 6G:
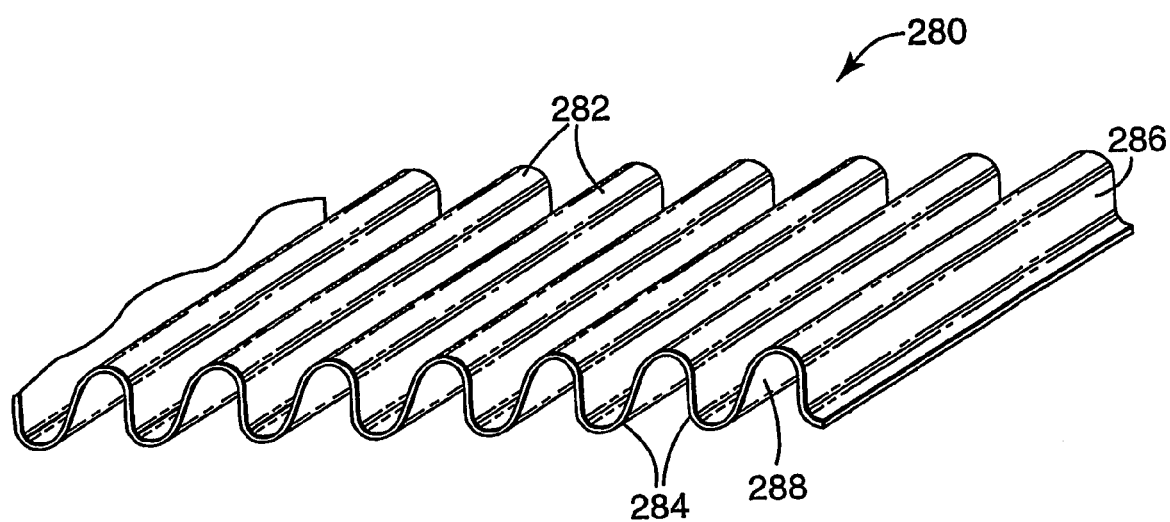
FIG. 6G and FIG. 6H are perspective views of corrugated curved articles.
Figure 6H:
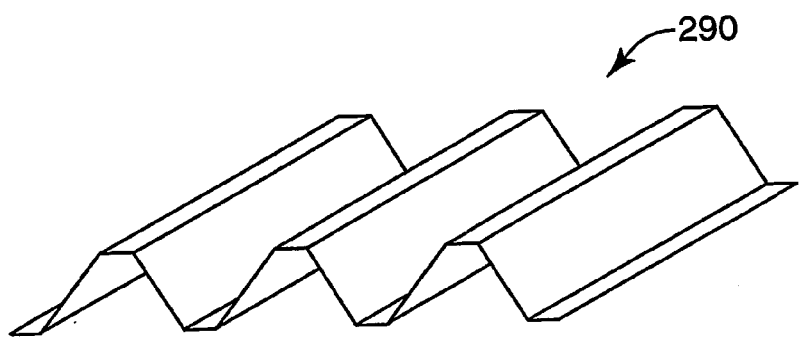

An undulated structure 280 that can be produced using such a corrugation process is shown in FIG. 6G. The undulations may be characterized by arcuate portions 282, valley portions 284, and intermediate portions 286 and 288 which connect the arcuate portions to the valley portions. While the undulations shown in FIG. 6G are sinusoidal in shape, it should be recognized that the corrugation process may create undulations of many other desired shapes, such as those in corrugated article 290 shown in FIG. 6H. In addition, the corrugates need not extend the full width or along the width of the preform. Rather, they may extend for any desired length and in any direction in the plane or general curvature of the preform.

Those skilled in the art will recognize that a wide variety of preforms and deforming techniques may be employed to provide a wide variety of permanently deformed films and articles.

Assembly of the EMI shielding films or articles in a completed device or adjacent to an enclosed area can be carried out using techniques that will be familiar to those skilled in the art. For example, representative construction details for EMI shielding windows can be found in *The Design of Shielded Enclosures: Cost-Effective Methods to Prevent EMI*, by Louis T. Gnecco (Newnes Publishing: Butterworth-Heinemann, Boston, 2000). Additional EMI shielding materials such as gaskets, tapes, fabrics, foams or other materials may be employed in combination with the EMI shielding films or articles. Representative EMI shielding equations and techniques for using such other materials are described in the book cited above; in *A Handbook Series on Electromagnetic Interference and Compatibility* (Interference Control Technologies, Inc., Gainesville, Va., 1988), especially *Volume 3: Electromagnetic Shielding*, by Donald R. J. White and Michel Mardiguian; *Volume 8: EMI Control Methodology and Procedures*, by Michel Mardiguian; and in *Chapter 8: Electromagnetic Compatibility for Electrical Engineering*, by B. A. Austin, of *Electrical Engineer's Reference Book*, by G. R. Jones, M. A. Laughton, and M. G. Say (Butterworth-Heinemann, Oxford, UK, 1993). Representative devices include instruments, displays (e.g., plasma displays), imaging equipment (e.g., magnetic resonance imaging equipment), computer equipment (e.g., servers), communications equipment (e.g., cellular phones), medical devices and the like. Representative enclosed areas include rooms (e.g., secure meeting rooms and test equipment facilities), transmission facilities (or portions thereof), cabinets, tents and the like.

Preferred embodiments of the EMI shielding films and articles can provide an optically transparent, flexible or extensible shield that can block the transmission of unwanted electromagnetic energy out of or into electronic equipment and other devices that can cause or are sensitive to electromagnetic interference. These preferred EMI shielding films and articles can provide dramatically better mechanical durability and corrosion resistance than typical commercially available optically transparent EMI shielding films, while providing comparable optical transparency and shielding power. Surprisingly, these preferred EMI shielding films retain their EMI shielding capability even when stretched, bent, or creased. The EMI shielding films preferably retain their EMI shielding capability when strained in a tensile mode by 5%, 10%, or more of their original length. More preferably, they retain their EMI shielding capability when strained in a tensile mode by 20%, 30%, 40% or even 50% or more of their original length. This is an unexpected result, since commercially available EMI shielding films lose their EMI shielding capability at strains well below 10% and even 5%, e.g., at 2% strain. The EMI shielding films preferably retain their EMI shielding capability when bent at a 45° angle, and more preferably when bent at a 90° angle. Most preferably, they retain their EMI shielding capability when bent or creased at a 180° angle. This is an unexpected result, since commercially available EMI shielding films lose their EMI shielding capability when bent or even when roughly handled.

The following tests were used to evaluate various EMI shielding films:

Corrosion Test

Two strips 25.4 mm wide by about 254 to 305 mm long were cut from the center of a film sample. The strips were placed in jars containing 20% KCl solution at room temperature so that about 150 to 200 mm of each strip was immersed into the salt solution. The jar tops were screwed onto the jars to prevent the salt solution from evaporating. The strips were removed after 15 minutes of immersion, placed support side down on a dry paper towel and wiped with tissue or a paper towel along the width of the strip. Medium pressure was applied while wiping. The strips were next washed with cold water to remove salt from the surface and the film surface appearance was observed. The appearance rating was based on a visual estimate of the amount of the metal layer removed after wiping the strip, expressed as a percentage of the original metal layer area.

Corrosion Under Electrical Current Test

Two strips 25.4 mm wide by 203 mm long were cut from the center of a film sample. The narrow ends of the strips were painted on both sides with No. 22-201 silver paint (Katy Company). After the silver paint dried, copper was folded over the painted edges to form a durable electrode at each end of the strip. Alligator clips were used to connect a power supply to the copper electrodes. A voltage of 4.0 volts was applied between the contacts and the resulting current was measured and recorded. A 125 to 150 mm long section near the center of each strip was then submerged into 20% KCl solution at room temperature. The electrical current was measured and recorded during the course of the immersion time.

Adhesion Test

Squares about 254 mm wide by about 254 mm long were cut from the center of a film sample. 25.4 mm wide by 178 mm long pieces of masking tape and filament tape were each applied to the film in both the MD and TD directions, pressed with a 2.3 kg roller, then aged for one week. The adhesion test rating was based on a visual estimate of the amount of the metal layer remaining after peeling away the tapes, expressed as a percentage of the original metal layer area.

Conductivity vs. Strain Test

As an approximate measure of the level of strain at which an EMI shielding film would lose its EMI shielding capability, EMI shielding film samples were stretched using a SINTECH™ 200/S TENSILE TESTER (Instron Corp.) to determine the percent strain at which the film would stop conducting electricity. A strip prepared as in the Corrosion Under Electrical Current test was clamped into the jaws of the tensile tester, and alligator clips were used to connect a power supply to the copper electrodes. While using a gauge length of 101.6 mm and a crosshead speed of 25.4 mm/min, a constant voltage of 4 volts was supplied to the strip and the current flow was measured and recorded vs. % strain.

Sheet Resistance Test

The EMI shielding films were evaluated for sheet resistance, or surface resistivity, using a non-contact conductivity measuring device (Model 717B Benchtop Conductance Monitor, Delcom Instruments Inc.).

Solar Heat Gain Coefficient and Shading Coefficient

The value Te is defined as the ratio, expressed in percent, of the solar energy transmitted by a specimen from 250 nm to 2500 nm divided by the total incident solar energy. The value Ae is defined as the ratio, expressed in percent, of the solar energy absorbed by a specimen from 250 nm to 2500 nm divided by the total incident solar energy. Solar properties are calculated using solar irradiance data from ASTM E891 using air mass 1.5. The Solar Heat Gain Coefficient (SHGC) is calculated as SHGC=Te+0.27(Ae).

The Shading Coefficient (SC) is defined as the ratio of the Solar Heat Gain Coefficient through a given glazing to that through a single pane of standard 3.2 mm thick window glass, and is calculated as

SC=SHGC/87.0.

EMI Shielding Strength

EMI Shielding Strength was evaluated according to ASTM D4935-99, via a far field type test using a coaxial TEM cell. The results are reported in decibels (dB).

The EMI shielding films and articles will now be described with reference to the following non-limiting examples, in which all parts and percentages are by weight unless otherwise indicated.

EXAMPLE 1

(Layer 1) An approximately 300 meter long roll of 0.05 mm thick by 508 mm wide PET support (MELINEX™ No. 453 film, DuPont Teijin Films) was loaded into a roll to roll vacuum chamber like that shown in FIG. 6A. The pressure in the vacuum chamber was reduced to $3\times10^{-4}$ torr. The support was sequentially plasma pretreated and acrylate coated during one pass at a web speed of 36.6 m/min. The plasma pretreatment utilized a chrome target and an unbalanced dc magnetron operated at 1500 watts power (429 volts and 3.5 amps) under a nitrogen atmosphere with a nitrogen gas flow of 70 sccm. The acrylate coating employed a 50:50 mixture of IRR214 acrylate (UCB Chemicals) and lauryl acrylate that had been degassed for 1 hour by placing a container of the liquid monomer mixture into a bell jar and reducing pressure to approximately 1 millitorr. The degassed monomer was pumped at a flow rate of 2.35 ml/min through an ultrasonic atomizer into a vaporization chamber maintained at 274° C. Using a drum temperature of −18° C., the monomer vapor was condensed onto the moving web and electron beam crosslinked using a single filament gun operated at 7.59 kV and 2.0 milliamps.

(Layer 2) The web direction was reversed. Again operating at 36.6 m/min, the acrylate surface was plasma treated and coated with magnetron sputtered silver. The plasma pretreatment was as before but at 413 volts and 3.64 amps. The silver was sputtered at 10,000 watts power (590 volts and 16.96 amps), a drum temperature of 25° C. and an argon atmosphere with an argon gas flow of 90 sccm.

(Layer 3) The web direction was again reversed. Again operating at 36.6 m/min, a crosslinked spacing layer was formed using the monomer mixture described above, but without plasma pretreatment of the silver surface prior to monomer deposition. Using a drum temperature of −17° C. and the other monomer deposition conditions described above, the monomer vapor was condensed onto the moving web and electron beam crosslinked using a single filament gun operated at 7.8 kV and 3.8 milliamps.

(Layer 4) The web direction was again reversed. Again operating at 36.6 m/min, the crosslinked spacing layer was plasma pretreated and coated with magnetron sputtered silver. The plasma pretreatment was as before but using 429 volts and 3.5 amps. The silver was sputtered as before but at 590 volts, 16.94 amps, and a drum temperature of 22° C.

(Layer 5) The web direction was again reversed. A protective layer was formed using the monomer mixture described above, but without plasma pretreatment of the silver surface prior to monomer deposition. Using a drum temperature of −17° C. and the other monomer deposition conditions described above, the monomer vapor was condensed onto the moving web and electron beam crosslinked using a single filament gun operated at 10.11 kV and 3.8 milliamps.

Figure 7:
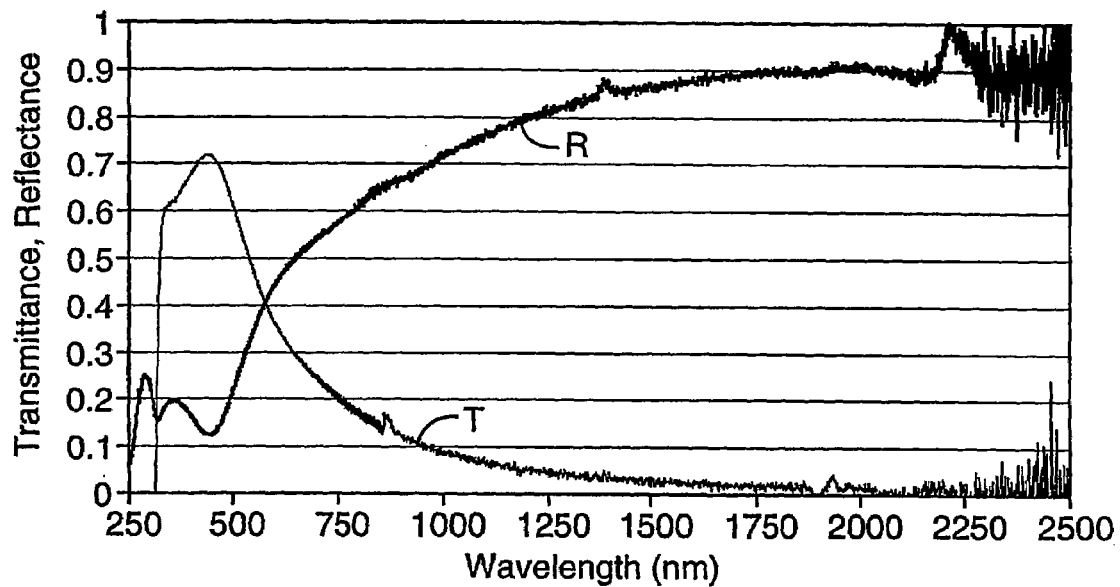
FIG. 7 and FIG. 8 are graphs showing transmittance and reflectance for the films of Example 1 and Example 2, respectively.

The optical properties of the resulting five layer infrared-rejecting acrylate/Ag/acrylate/Ag/acrylate optical stack are shown in FIG. 7. Curves T and R respectively show the transmission ($T_{vis}$) and reflection for the finished film. Using optical modeling and assuming a Bruggerman density for silver of 0.97, the five layers had calculated thicknesses of 120 nm (acrylate layer 1)/12 nm (Ag layer 2)/85 nm (acrylate layer 3)/12 nm (Ag layer 4)/120 nm (acrylate layer 5).

EXAMPLE 2

Using the method of Example 1, a PET support was covered with a five layer acrylate/Ag/acrylate/Ag/acrylate optical stack, but using plasma pretreatment on both the top and bottom of the metal layers. The individual layer differences were as follows:

(Layer 1) The support plasma pretreatment was as before but at 1000 watts power (402 volts and 2.5 amps) and a nitrogen gas flow of 102 sccm. The monomer flow rate was 2.45 ml/min and the vaporization chamber temperature was 276° C. The monomer vapor was condensed onto the moving web using a −21° C. drum temperature. The electron beam filament was operated at 8.0 kV and 6.5 milliamps.

(Layer 2) The plasma pretreatment was at 1000 watts power (309 volts and 3.34 amps) and a nitrogen gas flow of 90 sccm. The silver was sputtered at 570 volts and 17.88 amps, a drum temperature of 21° C. and an argon gas flow of 93.2 sccm.

(Layer 3) The silver surface was plasma pretreated prior to deposition of the spacing layer. The plasma pretreatment utilized a chrome target and 1000 watts power (308 volts and 3.33 amps). Using a drum temperature of −23° C., the monomer vapor was condensed onto the moving web and electron beam crosslinked using a single filament gun operated at 8.0 kV and 6.0 milliamps.

(Layer 4) The plasma pretreatment was at 316 volts and 3.22 amps, and the nitrogen gas flow rate was 90 sccm. The silver was sputtered at 567 volts and 17.66 amps, a drum temperature of 20° C., and an argon gas flow of 95.5 sccm.

(Layer 5) The silver surface was plasma pretreated prior to deposition of the protective layer. The plasma pretreatment was the same as in Layer 3. Using a drum temperature of −23° C., the monomer vapor was condensed onto the moving web and electron beam crosslinked using a single filament gun operated at 8.0 kV and 6.2 milliamps.

Figure 8:
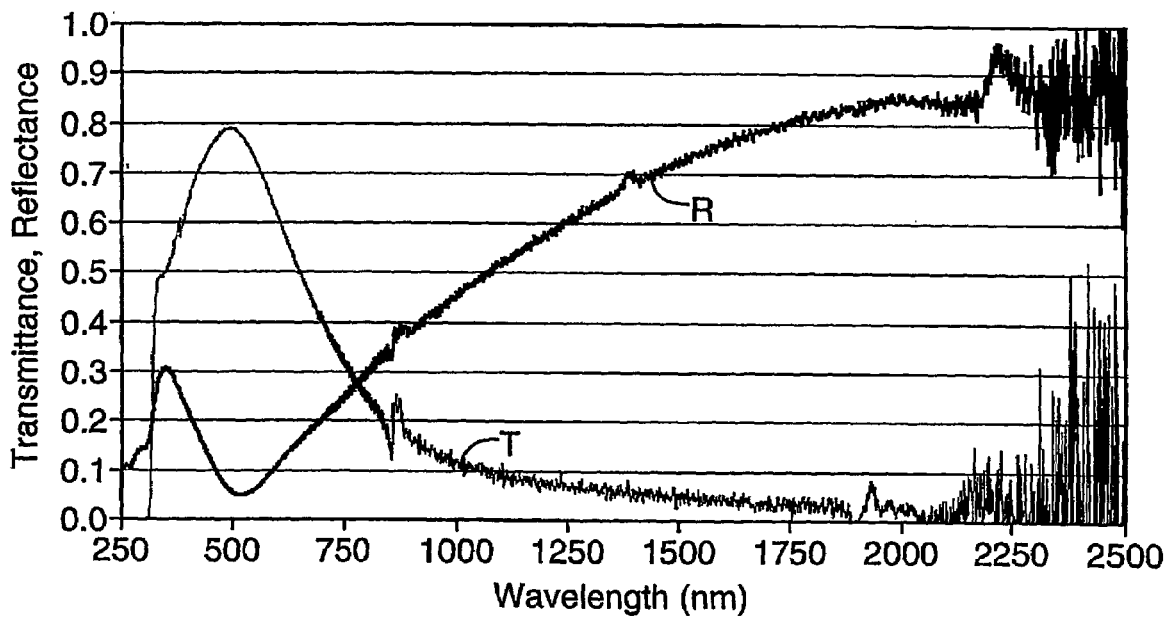

The optical properties of the resulting five layer infrared-rejecting acrylate/Ag/acrylate/Ag/acrylate optical stack are shown in FIG. 8. Curves T and R respectively show the transmission and reflection for the finished film. Using optical modeling and assuming a Bruggerman density for silver of 0.97, the five layers had calculated thicknesses of 120 nm (acrylate layer 1)/9 nm (Ag layer 2)/95 nm (acrylate layer 3)/9 nm (Ag layer 4)/120 nm (acrylate layer 5).

EXAMPLES 3-5

Using the method of Example 2, five layer infrared-rejecting acrylate/Ag/acrylate/Ag/acrylate optical stacks with silver layers of varying thickness were formed on a PET support. The resulting films were evaluated for appearance, transmission ($T_{vis}$), reflection, solar heat gain coefficient (SHGC), shading coefficient (SC) and sheet resistivity. The processing conditions and evaluation results are set out below in Table 1.

TABLE 1

|  | Ex.3 | Ex.4 | Ex.5 |
| --- | --- | --- | --- |
| Layer 1 |  |  |  |
| Deposited material | Monomers | Monomers | Monomers |
| Line speed (m/min) | 36.6 | 36.6 | 36.6 |
| Plasma (Watts) | 1000 | 1000 | 1000 |
| Drum temp (° C.) | −21 | −21 | −21 |
| Monomer feed (ml/min) | 2.65 | 2.65 | 2.65 |
| Layer 2 |  |  |  |
| Deposited material | Ag | Ag | Ag |
| Line speed (m/min) | 35.1 | 36.6 | 38.1 |
| Plasma (Watts) | 1000 | 1000 | 1000 |
| Drum temp (° C.) | 26 | 26 | 26 |
| Sputter power (kW) | 10 | 10 | 10 |
| Layer 3 |  |  |  |
| Deposited material | Monomers | Monomers | Monomers |
| Line speed (m/min) | 36.6 | 36.6 | 36.6 |
| Plasma (Watts) | 1000 | 1000 | 1000 |
| Drum temp (° C.) | −19 | −19 | −19 |
| Monomer feed (ml/min) | 2.65 | 2.65 | 2.65 |
| Layer 4 |  |  |  |
| Deposited material | Ag | Ag | Ag |
| Line speed (m/min) | 35.1 | 36.6 | 38.1 |
| Plasma (Watts) | 1000 | 1000 | 1000 |
| Drum temp (° C.) | 28 | 28 | 28 |
| Sputter power (kW) | 10 | 10 | 10 |
| Layer 5 |  |  |  |
| Deposited material | Monomers | Monomers | Monomers |
| Line speed (m/min) | 36.6 | 36.6 | 36.6 |
| Plasma (Watts) | 1000 | 1000 | 1000 |
| Drum temp (° C.) | −18 | −18 | −18 |
| Monomer feed (ml/min) | 1.35 | 1.35 | 1.35 |
| Results: |  |  |  |
| Appearance | Good | Good | Good |
| Trans-Luminous Y ($T_{vis}$) | 72.37 | 72.14 | 71.53 |
| Refl-Luminous Y | 12.36 | 10.92 | 11.18 |
| SHGC | 46.28 | 46.84 | 48.04 |
| SC | 0.5320 | 0.5384 | 0.5522 |
| Sheet Resistivity (Ohms/Square) | 3.929 | 4.505 | 4.673 |

Figure 9:
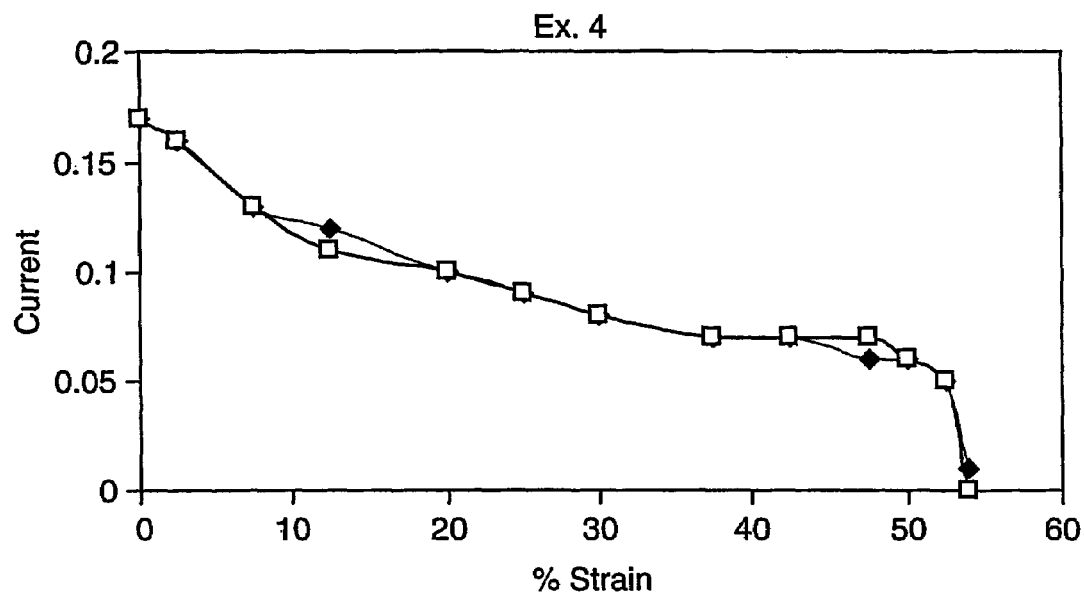
FIG. 9 through FIG. 11 are graphs showing conductance vs. strain for the films of Example 4, Example 5 and Example 11, respectively.
Figure 10:
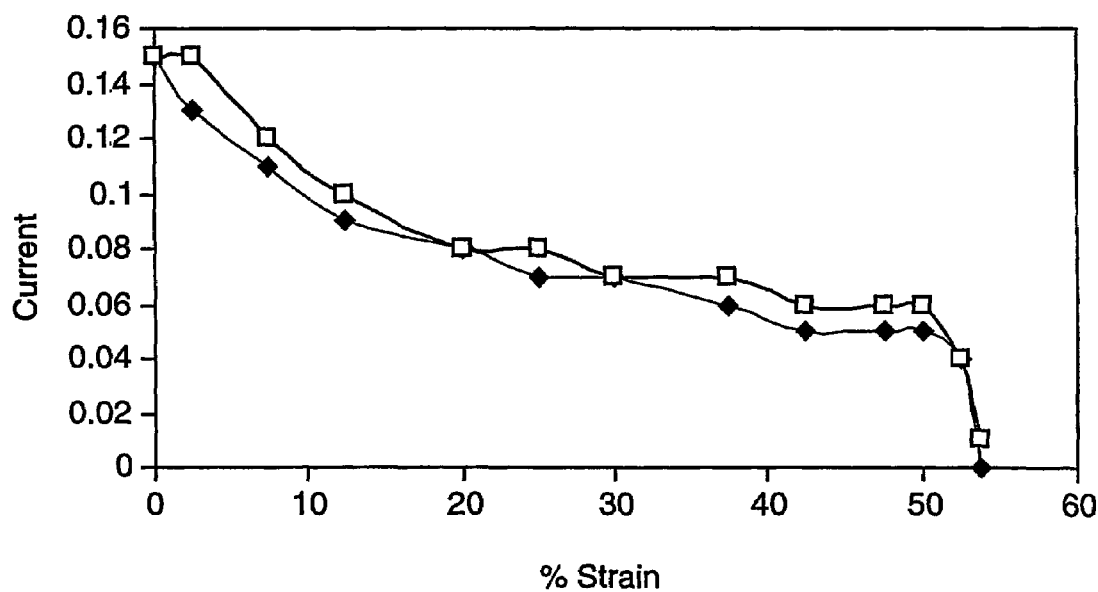

The results in Table 1 show the use of varying line speeds to alter the thickness of the metal layers. Films having a $T_{vis}$ as high as 72% and sheet resistance as low as 3.9 Ohms/square were obtained. Two samples each of the films of Examples 4 and 5 were also evaluated using the conductivity vs. strain test. The results are shown in FIG. 9 and FIG. 10, respectively. All film samples conducted current at up to 50% or more strain.

COMPARATIVE EXAMPLE 1

A commercial product based on transparent silver layers and an indium oxide inorganic dielectric (XIR™ 75 film, Southwall Technologies Inc.) was evaluated using the conductivity vs. strain test. The sample failed when subjected to only 1% strain.

EXAMPLES 6-11

Using the method of Examples 3 through 5, five layer infrared-rejecting acrylate/Ag/acrylate/Ag/acrylate optical stacks were formed on a PET support (Examples 6-9) or a birefringent multilayer optical film support (3M™ Solar Reflecting Film No. 41-4400-0146-3, Examples 10-11) and optionally given a plasma post-treatment. The thickness of Layer 5 was varied by altering the deposition conditions as shown below. The resulting films were evaluated for appearance, transmission, reflection, solar heat gain coefficient, shading coefficient and sheet resistivity. The processing conditions and evaluation results are set out below in Table 2.

TABLE 2

|  | Ex.6 | Ex.7 | Ex.8 | Ex.9 | Ex.10 | Ex.11 |
| --- | --- | --- | --- | --- | --- | --- |
| Support | PET | PET | PET | PET | MOF | MOF |
| Layer 1 |  |  |  |  |  |  |
| Deposited material | Monomers | Monomers | Monomers | Monomers | Monomers | Monomers |
| Line speed (m/min) | 36.6 | 36.6 | 36.6 | 36.6 | 36.6 | 36.6 |

TABLE 2-continued

|  | Ex.6 | Ex.7 | Ex.8 | Ex.9 | Ex.10 | Ex.11 |
|---|---|---|---|---|---|---|
| Plasma (Watts) | 1000 | 1000 | 1000 | 1000 | 1000 | 1000 |
| Drum temp (° C.) | −21 | −21 | −21 | −21 | −21 | −21 |
| Monomer feed (ml/min) | 2.65 | 2.65 | 2.65 | 2.65 | 2.65 | 2.65 |
| Layer 2 | | | | | | |
| Deposited material | Ag | Ag | Ag | Ag | Ag | Ag |
| Line speed (m/min) | 36.6 | 36.6 | 36.6 | 36.6 | 36.6 | 36.6 |
| Plasma (Watts) | 1000 | 1000 | 1000 | 1000 | 1000 | 1000 |
| Drum temp (° C.) | 26 | 26 | 26 | 26 | 19 | 19 |
| Sputter power (kW) | 10 | 10 | 10 | 10 | 10 | 10 |
| Layer 3 | | | | | | |
| Deposited material | Monomers | Monomers | Monomers | Monomers | Monomers | Monomers |
| Line speed (m/min) | 36.6 | 36.6 | 36.6 | 36.6 | 36.6 | 36.6 |
| Plasma (Watts) | 1000 | 1000 | 1000 | 1000 | 1000 | 1000 |
| Drum temp (° C.) | −19 | −19 | −19 | −19 | −20 | −20 |
| Monomer feed (ml/min) | 2.65 | 2.65 | 2.65 | 2.65 | 2.85 | 2.85 |
| Layer 4 | | | | | | |
| Deposited material | Ag | Ag | Ag | Ag | Ag | Ag |
| Line speed (m/min) | 36.6 | 36.6 | 36.6 | 36.6 | 36.6 | 36.6 |
| Plasma (Watts) | 1000 | 1000 | 1000 | 1000 | 1000 | 1000 |
| Drum temp (° C.) | 28 | 28 | 28 | 28 | 23 | 23 |
| Sputter power (kW) | 10 | 10 | 10 | 10 | 10 | 10 |
| Layer 5 | | | | | | |
| Deposited material | Monomers | Monomers | Monomers | Monomers | Monomers | Monomers |
| Line speed (m/min) | 36.6 | 36.6 | 36.6 | 36.6 | 36.6 | 36.6 |
| Plasma (Watts) | 1000 | 1000 | 1000 | 1000 | 1000 | 1000 |
| Drum temp (° C.) | −18 | −18 | −18 | −18 | −17 | −17 |
| Monomer feed (ml/min) | 1.45 | 1.25 | 1.35 | 1.35 | 1.35 | 1.35 |
| Plasma Post-Treatment | | | | | | |
| Line speed (m/min) | | | 36.6 | 36.6 | | 36.6 |
| Plasma (Watts) | | | 1500 | 1000 | | 1000 |
| Results: | | | | | | |
| Appearance | Good | Good | Good | Good | Good | Good |
| Trans-Luminous Y ($T_{vis}$) | 71.51 | 70.09 | 68.19 | 72.59 | 72.69 | 72.51 |
| Refl-Luminous Y | 11.73 | 12.02 | 11.86 | 7.75 | 11.16 | 10.15 |
| SHGC | 46.60 | 46.25 | 44.82 | 46.81 | 44.97 | 45.63 |
| SC | 0.5356 | 0.5316 | 0.5152 | 0.5381 | 0.5169 | 0.5244 |
| Sheet Resistivity (Ohms/Square) | 4.23 | 4.38 | 5.709 | 5.208 | 3.927 | 4.389 |

Figure 11:
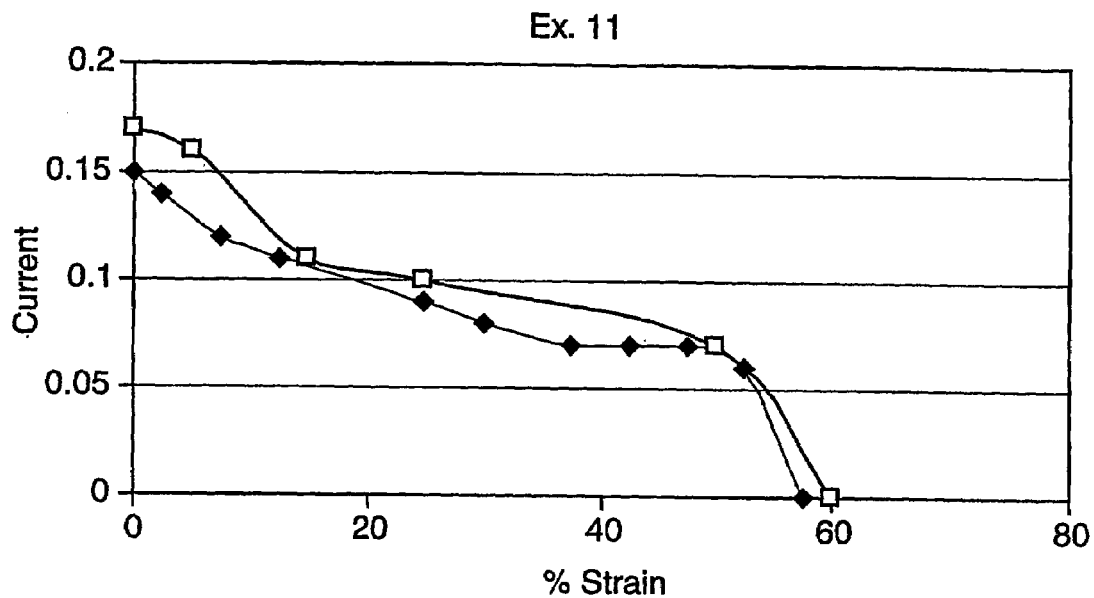

The results in Table 2 show the use of two different substrates, varying protective topcoat thickness and an optional plasma post-treatment of the topcoat. Films having a $T_{vis}$ as high as about 73% and sheet resistance as low as 3.9 Ohms/square were obtained. Two samples of the film of Example 11 were also evaluated using the conductivity vs. strain test. The results are shown in FIG. 11. Both film samples conducted current at up to 50% or more strain.

EXAMPLE 12

Using the method of Example 2, a PET support was covered with a five layer acrylate/Ag/acrylate/Ag/acrylate optical stack, but using plasma pretreatment on both the top and bottom of the metal layers. The individual layer differences were as follows:

(Layer 1) The support plasma pretreatment was at 1000 watts power but using 322 volts, 3.15 amps and a nitrogen gas flow of 70 sccm. The monomer flow rate was 2.65 ml/min and the vaporization chamber temperature was 274° C. The monomer vapor was condensed onto the moving web using a −20° C. drum temperature. The electron beam filament was operated at 8.04 kV and 5.7 milliamps.

(Layer 2) The plasma pretreatment was at 1000 watts power but using 378 volts, 3.09 amps and a nitrogen gas flow of 70 sccm. The silver was sputtered at 547 volts, 18.36 amps, a drum temperature of 26° C. and an argon gas flow of 70 sccm.

(Layer 3) The plasma pretreatment was at 1000 watts power but using 327 volts and 3.1 amps. The monomer vapor was condensed onto the moving web using a drum temperature of −19° C. The electron beam filament was operated at 8.04 kV and 6.3 milliamps.

(Layer 4) The plasma pretreatment was at 1000 watts power but using 328 volts, 3.07 amps and a nitrogen gas flow rate of 70 sccm. The silver was sputtered at 546 volts, 18.34 amps, a drum temperature of 28° C., and an argon gas flow of 70 sccm.

(Layer 5) The plasma pretreatment was at 1000 watts power but using 359 volts and 2.82 amps. The monomer vapor was condensed onto the moving web using a drum temperature of −18° C. The electron beam filament was operated at 8.04 kV and 4.6 milliamps.

Figure 12:
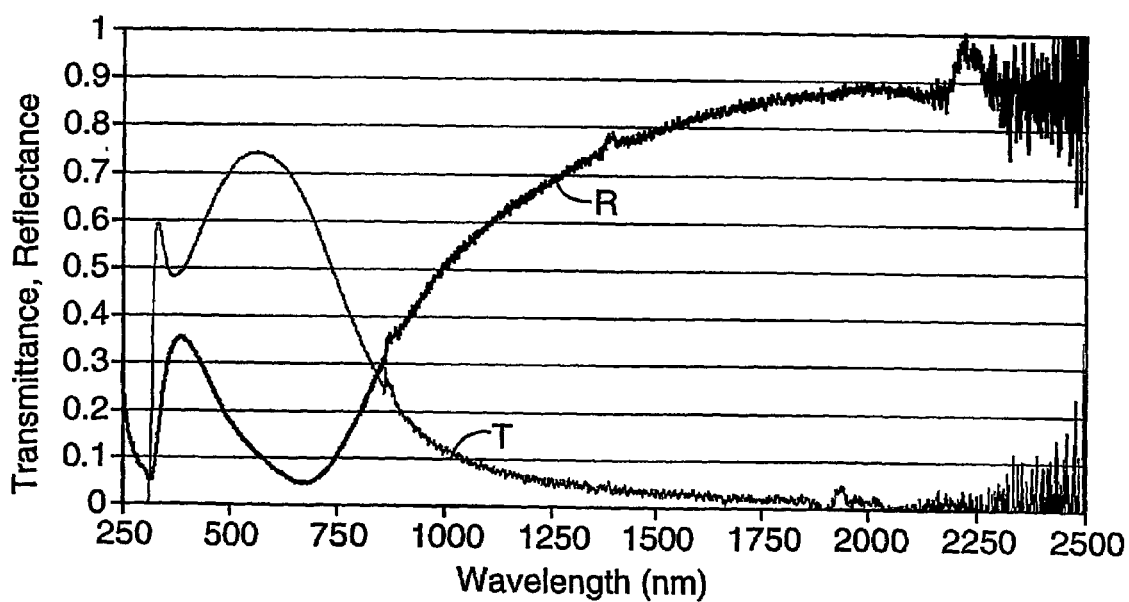
FIG. 12 through FIG. 15 are graphs showing transmittance and reflectance for the films of Example 12, Example 20, Example 21 and Example 22, respectively.

The optical properties of the resulting five layer infrared-rejecting acrylate/Ag/acrylate/Ag/acrylate optical stack are shown in FIG. 12. Curves T and R respectively show the transmission and reflection for the finished film. The film had a $T_{vis}$ of 71.5%. The film was next cut into a 30.5 cm by 2.54 cm strip. The edges were painted with a silver conductive paint (SILVER PRINT™, O.K Thorsen Inc.). A 2.54 cm by 2.54 cm copper foil was folded over each of the opposing narrow ends of the strip and connected using test leads equipped with alligator clips to a 0-20 volt power supply (Model 6253A dual DC, Hewlett Packard, Inc.). A voltage was applied to the strip, and the current and strip temperature were measured as a function of time. When the strip temperature stopped increasing, a higher voltage was applied. The results are shown below in Table 3.

TABLE 3

| Time (min) | Volts | Amps | Power (W) | Power (W/cm²) | Temp (° C.) |
|---|---|---|---|---|---|
| 0 | 0 | 0 | — | — | 23.4 |
| 1 | 16 | 0.265 | 4.24 | 0.0548 | 51.3 |
| 2 | 16 | 0.265 | 4.24 | 0.0548 | 54 |
| 3 | 16 | 0.265 | 4.24 | 0.0548 | 55.4 |
| 4 | 16 | 0.265 | 4.24 | 0.0548 | 56.4 |
| 6 | 16 | 0.265 | 4.24 | 0.0548 | 57.8 |
| 10 | 16 | 0.265 | 4.24 | 0.0548 | 58.8 |
| 11 | 20 | 0.34 | 6.8 | 0.0878 | 69.9 |
| 12 | 20 | 0.34 | 6.8 | 0.0878 | 73.1 |
| 15 | 20 | 0.34 | 6.8 | 0.0878 | 75.6 |
| 17 | 20 | 0.34 | 6.8 | 0.0878 | 76.4 |
| 19 | 20 | 0.34 | 6.8 | 0.0878 | 76.3 |
| 21 | 24 | 0.42 | 10.08 | 0.1302 | 103.1 |
| 22 | 24 | 0.42 | 10.08 | 0.1302 | 99.8 |
| 23 | 24 | 0.42 | 10.08 | 0.1302 | 103.5 |
| 25 | 24 | 0.42 | 10.08 | 0.1302 | 105.4 |
| 29 | 24 | 0.42 | 10.08 | 0.1302 | 106.9 |
| 33 | 24 | 0.42 | 10.08 | 0.1302 | 107.4 |
| 34 | 24 | 0.42 | 10.08 | 0.1302 | 107.4 |

The results in Table 3 show that the film could withstand very high power densities and very high temperatures without circuit failure. The strip was allowed to cool and then 16 volts were applied to the strip, resulting in a measured current of 0.27 amps. The film became warm to the touch. The film was next bent over the edge of a counter top at a 45° angle, and then at a 90° angle. The film still felt warm to the touch and the current remained at 0.27 amps. The film was next bent at a 180° angle. The sample still felt warm to the touch and the current remained at 0.27 amps. Had cracking occurred, hot spots would have arisen in the film and a substantial current change (or a complete cessation of current flow) would have been observed, accompanied by a loss in EMI shielding capability.

COMPARATIVE EXAMPLE 2

Using the method of Example 12, a sample of XIR 75 indium oxide film (Southwall Technologies Inc.) was powered and heated. The sample failed when subjected to 24 volts or when bent. The results are set out below in Table 4.

TABLE 4

| Time (min) | Volts | Amps | Power (W) | Power (W/cm²) | Temp (° C.) |
|---|---|---|---|---|---|
| 0 | 8 | 0.122 | 0.976 | 0.0130 | 23.1 |
| 2 | 8 | 0.122 | 0.976 | 0.0130 | 32.3 |
| 4 | 8 | 0.122 | 0.976 | 0.0130 | 33 |
| 6 | 8 | 0.122 | 0.976 | 0.0130 | 33.4 |
| 7 | 8 | 0.122 | 0.976 | 0.0130 | 33.6 |
| 8 | 8 | 0.122 | 0.976 | 0.0130 | 33.4 |
| 10 | 12 | 0.182 | 2.184 | 0.0291 | 41.7 |
| 11 | 12 | 0.182 | 2.184 | 0.0291 | 42.5 |
| 12 | 12 | 0.182 | 2.184 | 0.0291 | 43 |
| 13 | 12 | 0.182 | 2.184 | 0.0291 | 43.1 |
| 14 | 12 | 0.182 | 2.184 | 0.0291 | 43.5 |
| 15 | 12 | 0.182 | 2.184 | 0.0291 | 43.6 |
| 16 | 12 | 0.182 | 2.184 | 0.0291 | 43.6 |
| 17 | 12 | 0.182 | 2.184 | 0.0291 | 43.7 |
| 18 | 12 | 0.182 | 2.184 | 0.0291 | 43.7 |
| 20 | 16 | 0.24 | 3.84 | 0.0512 | 53.3 |
| 22.5 | 16 | 0.24 | 3.84 | 0.0512 | 55.1 |
| 25 | 16 | 0.24 | 3.84 | 0.0512 | 55.7 |
| 26 | 16 | 0.24 | 3.84 | 0.0512 | 55.7 |
| 27 | 16 | 0.24 | 3.84 | 0.0512 | 55.5 |
| 28 | 16 | 0.24 | 3.84 | 0.0512 | 55.7 |
| 30 | 20 | 0.29 | 5.8 | 0.0773 | 67.3 |
| 32 | 20 | 0.29 | 5.8 | 0.0773 | 71.2 |
| 34 | 20 | 0.29 | 5.8 | 0.0773 | 72 |
| 37.5 | 20 | 0.29 | 5.8 | 0.0773 | 72.3 |
| 38 | 20 | 0.29 | 5.8 | 0.0773 | 72.8 |
| 39 | 20 | 0.29 | 5.8 | 0.0773 | 72.7 |
| 40 | 20 | 0.29 | 5.8 | 0.0773 | 72.7 |
| 41 | 24 | 0 | (Failed) | (Failed) | — |

The results in Table 4 show that the comparison film could be electrically heated. However, when the voltage was increased to 24 volts the film failed. This was believed to be due to cracking of the indium oxide layer. A separate sample of the comparison film was electrically heated using an applied voltage of 16 volts, resulting in a measured current of 0.235 amps. The comparison film became warm to the touch. When the comparison film was bent over the edge of a counter top at a 45° angle, the film failed. Using optical microscopy, a crack could be observed in the coating.

EXAMPLE 13

A 304 mm by 304 mm sample of the film of Example 5 having a sheet resistance of 4.2 ohms/square was electrically joined to busbars so that both metal layers could be grounded.

EXAMPLE 14

A PET support was covered with a three layer acrylate/Ag/acrylate stack. The individual layers were formed as follows:

(Layer 1) A 914 meter long roll of 0.05 mm thick×508 mm wide PET film (MELINEX™ No. 453 film, DuPont-Teijin Films) was loaded into a roll to roll vacuum chamber, and the chamber pressure was pumped to a pressure of $8\times10^{-6}$ torr. The PET film was coated with an acrylate mixture containing 48.5% IRR214 acrylate, 48.5% lauryl acrylate, and 3.0% EBECRYL™ 170 adhesion promoter. The acrylate mixture was vacuum degassed prior to coating, and pumped at a flow rate of 2.35 ml/min. through an ultrasonic atomizer into a vaporization chamber maintained at 275° C. The PET film was passed over a coating drum maintained at 0° C. at a web speed of 30.4 meters/min, where the monomer vapor was condensed, and then electron beam crosslinked with a single filament operated at 8.0 kV and 2.0 milliamps. This produced an acrylate layer having a 100 nm thickness after cure.

(Layer 2) The web direction was reversed inside the chamber, and the acrylate surface was sputter coated with a silver layer. The silver was sputtered at 10 kW power, using argon as the sputtering gas at a chamber pressure of 2.0 millitorr, and a web speed of 30.4 meters/minute to provide a 10 nm thick silver layer.

(Layer 3) The web direction was again reversed. Using the same conditions as for Layer 1, a 100 nm thick acrylate layer was deposited onto the silver layer.

The resulting three layer film stack exhibited good spectral transmission and reflectance characteristics (i.e., was light transmissive), and had an electrical resistivity of 10 ohms/sq. When the Corrosion Under Electrical Current Test was performed the current fell to zero a few seconds after immersion. This indicated that silver corrosion, electrical circuit failure and likely loss of EMI shielding capability had taken place more rapidly than would be desirable under severe corrosion conditions.

EXAMPLE 15

A second three layer film stack was prepared in the same manner as Example 14, but using a nitrogen plasma pretreatment of the PET, Layer 1 acrylate coating and Layer 2 silver coating prior to the deposition of the subsequent layer. The resulting film was light transmissive. The nitrogen plasma was applied using an unbalanced dc magnetron source, operated at 1.0 kW and 2.0 millitorr pressure. When the Corrosion Under Electrical Current Test was performed the current did not fall to zero until 500 to 600 seconds after immersion, indicating much slower silver corrosion and electrical circuit failure than in Example 14, and improved retention of EMI shielding capability.

EXAMPLE 16

A three layer film stack was prepared in the same manner as Example 14, with the addition of 2% ethylene glycol bis-thioglycolate to the monomer mixture. The resulting film was light transmissive. When the Corrosion Under Electrical Current Test was performed the current fell to zero 500 to 600 seconds after immersion, indicating slower silver corrosion and electrical circuit failure than in Example 14, and comparable performance to Example 15.

EXAMPLE 17

A three layer film stack was prepared in the same manner as Example 14, but using nitrogen plasma pretreatment as in Example 15 and a 2% ethylene glycol bis-thioglycolate addition as in Example 16. The resulting film was light transmissive. When the Corrosion Under Electrical Current Test was performed the current remained constant for over 900 seconds after immersion, at which time the test was terminated. This indicated that silver corrosion and the likelihood of circuit failure and loss of EMI shielding capability had been further reduced in comparison to Examples 14 to 16.

EXAMPLE 18

The film of Example 12 was tested for optical transmission at 550 nm, Sheet Resistance and EMI Shielding Strength. The measured optical transmission was 75%, the surface resistivity was 4.5 Ohm/sq, and the EMI shielding strength was 29 dB.

COMPARATIVE EXAMPLE 3

Using the method of Example 18, a sample of AgHT™-4 optically transparent EMI shielding film (CP Films) was evaluated. The measured optical transmission was 76%, the surface resistivity was 4.7 Ohm/sq, and the EMI shielding strength was 29 dB. The film was crinkled by hand and retested for EMI Shielding Strength. The EMI shielding strength decreased to 5 dB. A fresh sample of the film was also evaluated for corrosion and strain resistance. Circuit failure occurred in 20 seconds in the Corrosion Under Electrical Current Test, and conductivity fell to zero at 2% strain in the Conductivity vs. Strain Test.

EXAMPLE 19

Using the method of Example 12, a PET support was covered with a five layer acrylate/Aglacrylate/Ag/acrylate optical stack using plasma pretreatment on both the top and bottom of the metal layers. The monomer mixture contained 2% ethylene glycol bis-thioglycolate. The other individual layer differences were as follows:

(Layer 1) The support plasma pretreatment was at 1000 watts power but using 428 volts and 2.3 amps. The monomer vapor was condensed onto the moving web using a −17° C. drum temperature. The electron beam filament was operated at 8.0 kV and 2.8 milliamps.

(Layer 2) The plasma pretreatment was at 1000 watts power but using 368 volts and 2.72 amps. The silver was sputtered at 632 volts, 15.8 amps, a drum temperature of 31° C. and an argon gas flow of 87 sccm.

(Layer 3) The plasma pretreatment was at 1000 watts power but using 430 volts and 2.3 amps. The monomer vapor was condensed onto the moving web using a drum temperature of −17° C. The electron beam filament was operated at 8.0 kV and 4.8 milliamps.

(Layer 4) The plasma pretreatment was at 1000 watts power but using 368 volts and 2.72 amps. The silver was sputtered at 634 volts, 15.8 amps, a drum temperature of 32° C., and an argon gas flow of 87 sccm.

(Layer 5) The plasma pretreatment was at 1000 watts power but using 448 volts and 2.2 amps. The monomer vapor was condensed onto the moving web using a drum temperature of −19° C. The electron beam filament was operated at 8.0 kV and 5.7 milliamps.

The measured optical transmission of the resulting film was 70%, the surface resistivity was 5.6 Ohm/sq, and the EMI Shielding Strength was 28 dB. The film was crinkled by hand as in Comparative Example 3 and retested for EMI Shielding Strength. The EMI Shielding Strength remained at 28 dB, indicating full retention of EMI shielding ability.

EXAMPLE 20

Using the general method of Example 1 (but employing chromium sputtering in place of plasma pretreatment in order to deposit a layer of chromium metal), a PET support was covered with a seven layer acrylate/Cr/Ag/acrylate/Cr/Ag/acrylate optical stack. The monomer mixture contained a 43:43:14 mixture of IRR214 acrylate, lauryl acrylate and DAROCUR™ 1173 photoinitiator (Ciba Specialty Chemicals). The photoinitiator was added to the monomer mixture after vacuum degassing and just prior to coating. The individual layers were formed as follows:

(Layer 1) The pressure in the vacuum chamber was reduced to $2 \times 10^{-5}$ torr. The support was sequentially plasma pretreated and acrylate coated in one pass at a 24.4 m/min web speed, using a 500 sccm nitrogen gas flow, RF plasma power of 800 watts at 450 kHz, and a −9.4° C. coating drum temperature. The three component monomer mixture was pumped at a 1.5 ml/min flow rate. UV lamps were employed to cure the monomer mixture.

(Layer 2) The web direction was reversed. The acrylate layer was coated with chromium at 12.2 m/min using 2.5 kW DC sputtering power and a 10 sccm argon gas flow.

(Layer 3) The web direction was reversed. The chromium layer was coated with silver at 24.4 m/min using 9.0 kW DC sputtering power and a 10 sccm argon gas flow.

(Layer 4) Sequentially in the same pass, the silver layer was coated with the monomer mixture as in Layer 1.

(Layer 5) The web direction was reversed. The acrylate layer was coated with chromium as in Layer 3.

(Layer 6) The web direction was reversed. Operating at 24.4 m/min, the chromium layer was coated with silver as in Layer 4.

(Layer 7) Sequentially in the same pass, the silver layer was coated with the monomer mixture as in Layer 1.

Figure 13:
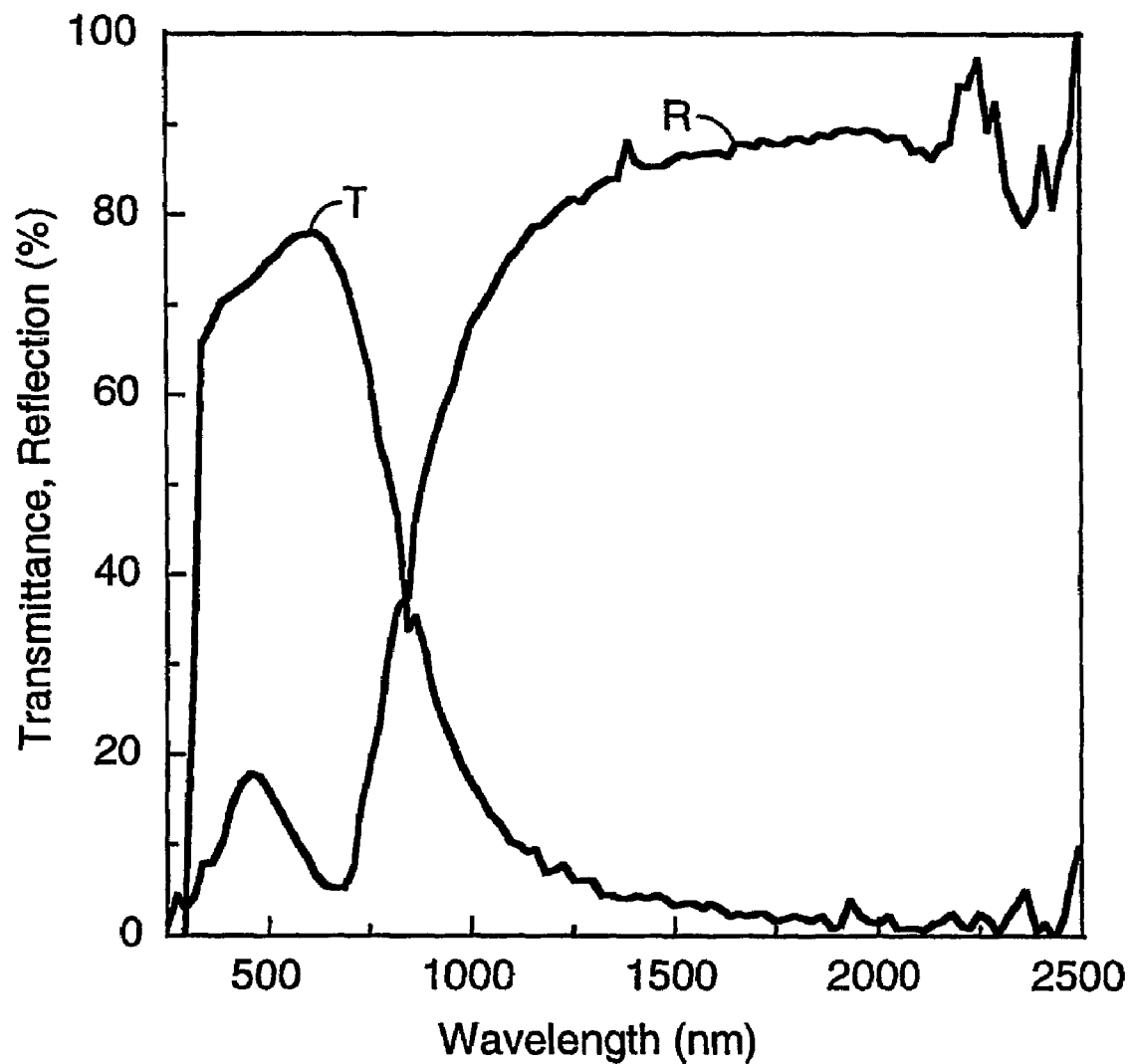

The optical properties of the resulting seven layer infrared-rejecting acrylate/Cr/Ag/acrylate/Cr/Ag/acrylate optical stack are shown in FIG. 13. Curves T and R respectively show the transmission and reflection for the finished film. The finished film possessed a visible transmission of 76%, haze of 0.68%, surface resistivity of 5.9 Ohms/sq and EMI shielding strength of 33 dB at 5 GHz.

EXAMPLE 21

Using the general method of Example 20, a PET support was covered with a six layer Ti/Ag/acrylate/Ti/Ag/acrylate optical stack. The monomer mixture contained a 64:28:8 mixture of IRR214 acrylate, lauryl acrylate, and ethylene glycol bis-thioglycolate. The individual layers were formed as follows:

(Layer 1) The support as supplied by the manufacturer includes an unidentified treatment on one side. The untreated side of the support was coated with titanium at 36.6 m/min using a $-23°$ C. drum temperature, 2.8 kW DC sputtering power (426 volts and 6.8 amps) and a 50 sccm argon gas flow.

(Layer 2) Sequentially in the same pass, the titanium layer was coated with silver using a $-23°$ C. drum temperature, 15 kW DC sputtering power (779 volts and 19.6 amps) and a 150 sccm argon gas flow.

(Layer 3) Sequentially, in the same pass, the silver layer was coated with the monomer mixture using a flow rate of 2.4 ml/min, a $274°$ C. vaporization chamber temperature, a $-23°$ C. drum temperature and a single filament electron beam gun operated at 7.5 kV and 9.7 milliamps.

(Layer 4) The web direction was reversed. The acrylate layer was coated with titanium at 36.6 m/min using a $-16°$ C. drum temperature, 2.8 kW DC (412 volts and 11.1 amps) sputtering power and a 90 sccm argon gas flow.

(Layer 5) Sequentially in the same pass, the titanium layer was coated with silver using a $-16°$ C. drum temperature, 15 kW DC sputtering power (778 volts and 19.5 amps) and a 150 sccm argon gas flow.

(Layer 6) Sequentially in the same pass, the silver layer was coated with the monomer mixture as in Layer 3 using a $-17°$ C. drum temperature and a single filament electron beam gun operated at 7.5 kV and 7.2 milliamps.

Figure 14:
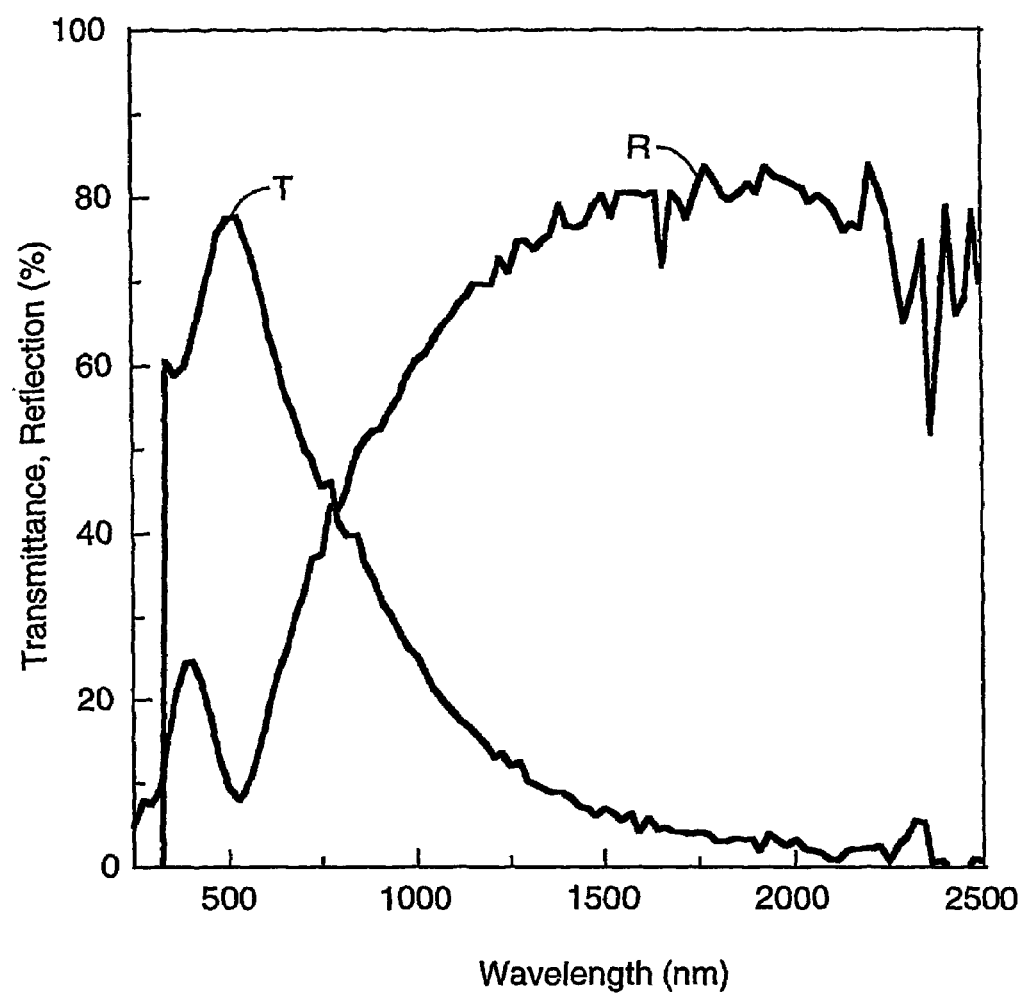

The optical properties of the resulting six layer infrared-rejecting Ti/Ag/acrylate/Ti/Ag/acrylate optical stack are shown in FIG. 14. Curves T and R respectively show the transmission and reflection for the finished film. The finished film possessed a visible transmission of 73%, haze of 0.44% and surface resistivity of 6.2 Ohms/sq.

EXAMPLE 22

Using the general method of Example 21, a PET support was covered with a six layer Ti/Ag/acrylate/Ti/Ag/acrylate optical stack. The individual layers were formed as follows:

(Layer 1) The pressure in the vacuum chamber was reduced to $1.5 \times 10^{-4}$ torr. The web was coated with titanium at 24.4 m/min using a $-17°$ C. drum temperature, 2.8 kW DC sputtering power (404 volts and 7.2 amps) and a 10 sccm argon gas flow.

(Layer 2) Sequentially in the same pass, the titanium layer was coated with silver using a $-17°$ C. drum temperature, 15 kW DC sputtering power (742 volts and 20.5 amps) and a 90 sccm argon gas flow.

(Layer 3) Sequentially in the same pass, the silver layer was coated with the monomer mixture using a flow rate of 1.8 ml/min, a $274°$ C. vaporization chamber temperature, a $-18°$ C. drum temperature and a single filament electron beam gun operated at 7.5 kV and 10.9 milliamps.

(Layer 4) The web direction was reversed. The acrylate layer was coated with titanium at 24.4 m/min using a $-16°$ C. drum temperature, 2.8 kW DC (371 volts and 7.8 amps) sputtering power and a 10 sccm argon gas flow.

(Layer 5) Sequentially in the same pass, the titanium layer was coated with silver using a $-16°$ C. drum temperature, 15 kW DC sputtering power (739 volts and 20.6 amps) and a 90 sccm argon gas flow.

(Layer 6) The web direction was reversed. The silver layer was coated with the monomer mixture as in Layer 3 and at 45.7 m/min using a flow rate of 1.5 ml/min, an $-18°$ C. drum temperature and a single filament electron beam gun operated at 7.5 kV and 4.1 milliamps.

Figure 15:
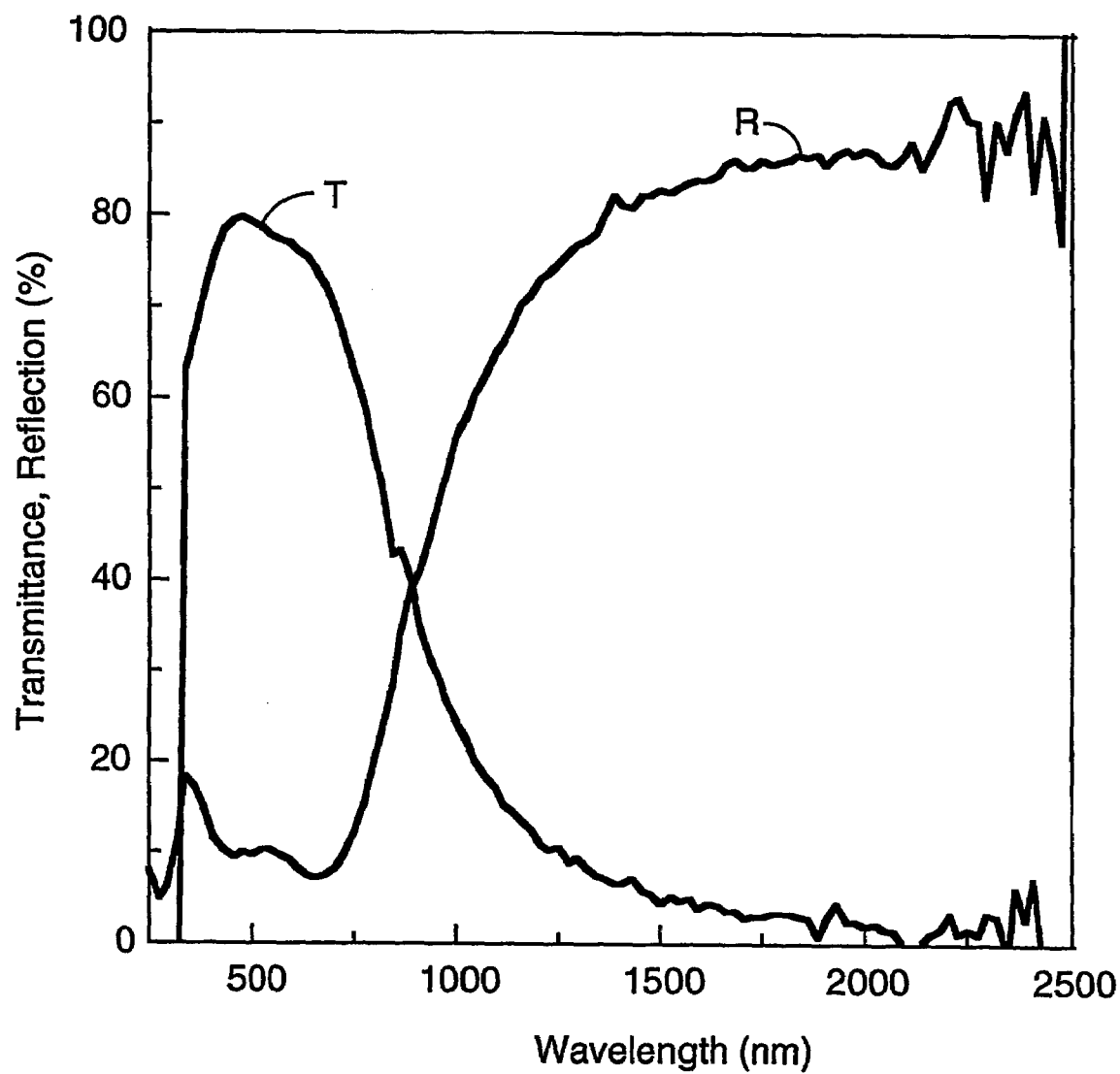

The optical properties of the resulting six layer infrared-rejecting Ti/Ag/acrylate/Ti/Ag/acrylate optical stack are shown in FIG. 15. Curves T and R respectively show the transmission and reflection for the finished film. The finished film exhibited visible transmission of 78%, haze of 0.76%, surface resistivity of 6.5 Ohms/sq and EMI shielding strength of 32 dB at 5 GHz.

EXAMPLE 23

The film of Example 20 was thermoformed so that a portion of the film had a three-dimensional semispherical indentation. The thermoforming process was carried out by taping the film over a 45 mm diameter hole in a plastic slab. Vacuum was pulled on the film through the hole in the slab while heating the film using a heat gun until the film was hot enough to deform downward into the hole. The heat gun was removed and the film was permitted to cool and removed from the slab. The resulting thermoformed semispherical indentation had a 5 mm depth with respect to the nominally planar region of the remaining film. The indentation persisted when the film was held by hand at two opposing ends and pulled sufficiently taut to remove apparent slackness. The deformed region was light transmissive and exhibited a surface resistivity of 5.5 Ohms/sq and haze of 1.6% compared to values of 5.9 Ohms/sq and 0.68%, for the non-thermoformed film.

COMPARATIVE EXAMPLE 4

Using the method of Example 23, XIR 75 indium oxide film was thermoformed so that a portion of the film had a three-dimensional semispherical indentation. The surface resistivity of the thermoformed region increased to 5,000 Ohms/sq compared to 5.2 Ohms/sq for the non-thermoformed film. The large surface resistivity for the thermoformed film is consistent with loss of one or more of electrical conductivity, infrared reflectivity and EMI shielding strength. The haze of the thermoformed region increased to 13.9% compared to 0.56% for the non-thermoformed film.

COMPARATIVE EXAMPLES 5-8

Using the method of Example 23, several commercially available films from CPFilms, Inc. were thermoformed so that a portion of each film had a three-dimensional semi-spherical indentation. The films were characterized for surface resistivity. The results are shown below in Table 5.

TABLE 5

|  | Comp. Ex.5 | Comp. Ex.6 | Comp. Ex.7 | Comp. Ex.8 |
| --- | --- | --- | --- | --- |
| Film | AgHT-4 | AgHT-8 | OC-50 | ARAL70 |
| Surface Resistivity (before thermoforming, Ohms/sq) | 3.4 | 8.4 | 52 | 20 |
| Surface Resistivity (after thermoforming, Ohms/sq) | 413 | 316 | 719 | 585 |

The above results show that the commercial films exhibited significant increases in surface resistivity (consistent with loss of one or more of electrical conductivity, infrared reflectivity and EMI shielding strength) when an attempt was made to thermoform them.

EXAMPLE 24

The film of Example 21 was laminated to a 0.25 mm thick supplemental polycarbonate support (LEXAN™ 8010, General Electric) using No. 467MP transfer adhesive (3M). The resulting laminated construction was placed in a convection oven at 125° C. for about 20 min to allow the adhesive to dry. The laminated construction was subsequently thermoformed into a three-dimensional shape corresponding to the front face of a cell phone. The thermoforming process employed a Labform Pressure Former (Hydro-Trim Corporation) operated with a 90 second preheat at about 222° C., followed by a 90 second thermoforming step at the same temperature. The resulting thermoformed part was transparent, relatively rigid and self-supporting, with permanently deformed compound curved features. The surface resistivity of the resulting thermoformed part was 6.0 Ohms/sq which is very similar to the 6.2 Ohms/sq surface resistivity for the non-thermoformed film.

Figure 16:
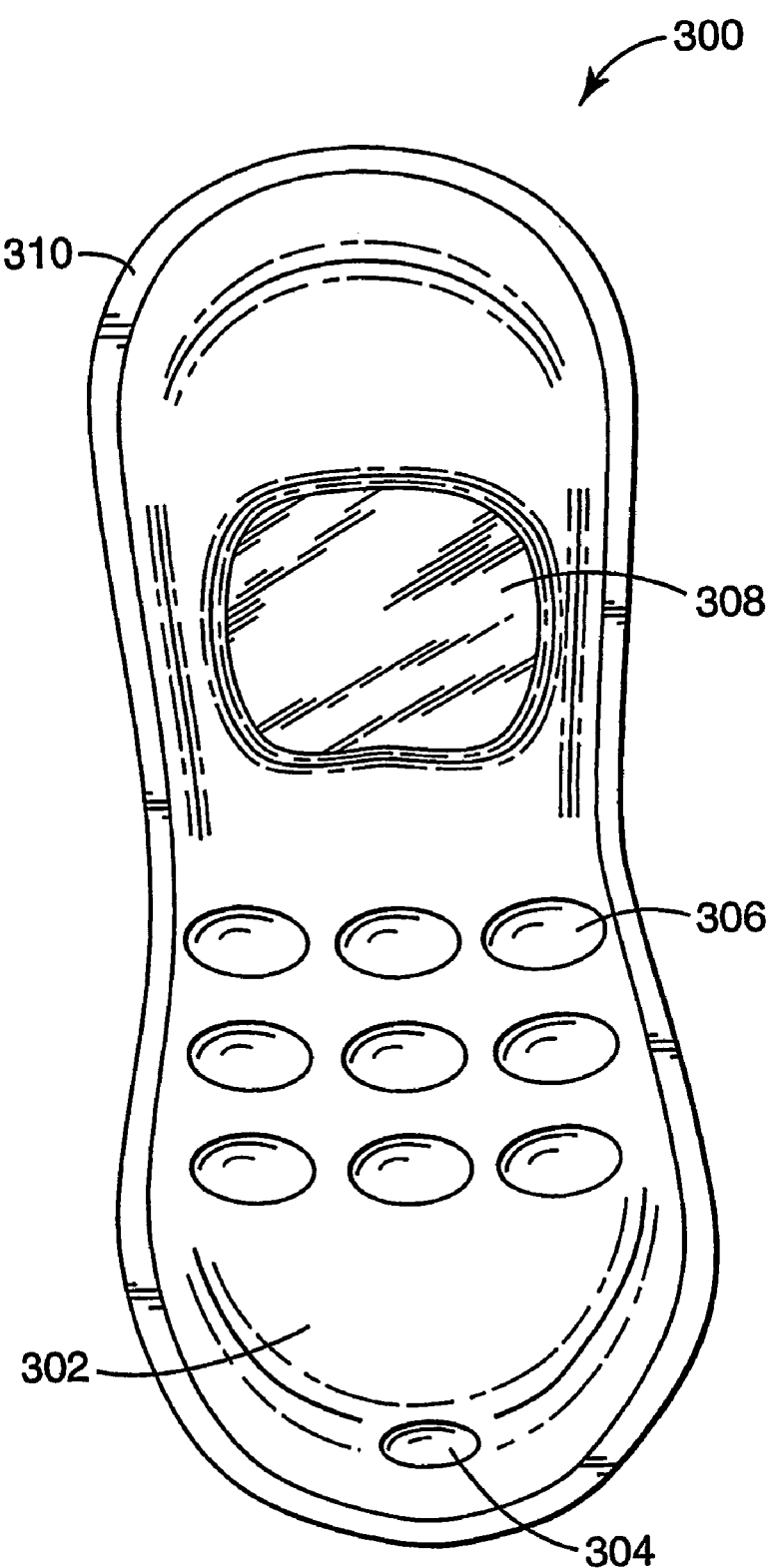
FIG. 16 is a schematic plan view of a compound curved shape formed in Example 24.

The thermoformed part is illustrated in FIG. 16. Cell phone cover 300 has a face portion 302 with a generally convex shape as viewed from the front. Indentation 304 designates the microphone location. Indentations 306 designate the keypad button locations. Region 308 designates the display area. Molding flange 310 surrounds face portion 302, and can be removed from the finished phone cover using techniques that will be familiar to those in the art of making molded plastic objects.

COMPARATIVE EXAMPLE 9

Using the method of Example 24, XIR 75 indium oxide film was laminated to a 0.25 mm thick polycarbonate supplemental support and thermoformed. The resulting thermoformed part was transparent. The surface resistivity of the thermoformed laminated construction containing XIR 75 film was 990 Ohms/sq. This is much higher than the 5.2 Ohms/sq surface resistivity of the non-thermoformed film.

EXAMPLE 25

The film of Example 21 was laminated between a 0.25 mm thick polycarbonate supplemental support (Lexan 8010, General Electric) and VIKUITT™ Enhanced Specular Reflector (ESR) multilayer optical film (3M) using No. 467MP transfer adhesive (3M). The resulting laminated construction was dried, then thermoformed into the same three-dimensional cell phone front face shape using the method of Example 24. The VIKUITI ESR film surface was placed against the mold. The resulting thermoformed part was not light transmissive and possessed a silver appearance due to the inclusion of the VIKUITI ESR film in the construction under the transparent Example 21 film and polycarbonate supplemental support. The surface resistivity of the resulting thermoformed part was 6.4 Ohms/sq which is very similar to the 6.2 Ohms/sq surface resistivity of the non-thermoformed film.

COMPARATIVE EXAMPLE 10

Using the method of Example 25, XIR 75 indium oxide film was laminated between a 0.25 mm thick polycarbonate supplemental support and VIKUITI ESR Film, dried, and thermoformed into the same three-dimensional cell phone front face shape. The resulting thermoformed part possessed a silver appearance due to the inclusion of the VIKUIKI ESR film but the surface resistivity of the thermoformed part was 840 Ohms/sq. This is much greater than the 5.2 Ohms/sq surface resistivity of the non-thermoformed XIR 75 film.

EXAMPLE 26

The film of Example 22 was embossed so that it possessed a three-dimensional pattern. The embossing pattern was produced by feeding the film of Example 22 at 1.5 m/min through overlapping heated nip rolls having mating diamond-shaped projections and recesses. The temperature of the nip rolls was between 176-193° C. The film's surface resistivity actually decreased following embossing, to 3.75 Ohms/sq for the embossed film compared to 6.5 Ohms/sq for the unembossed film.

COMPARATIVE EXAMPLE 11

Using the method of Example 26, XIR 75 indium oxide film was embossed in a diamond pattern. The surface resistivity of the XIR 75 film increased following embossing, to 885 Ohms/sq for the embossed film compared to 5.2 Ohms/sq for the unembossed film.

EXAMPLE 27

Using the general method of Examples 1 and 20, a PET support was plasma treated and covered with a three layer chromium/acrylate/aluminum stack. The individual layers were formed as follows:

(Layer 1) The pressure in the vacuum chamber was reduced to $3 \times 10^{-4}$ torr. The support was plasma pretreated in a separate pass at 15.2 m/min, using a chrome target and an unbalanced dc magnetron operated at 1.5 kW power (429 volts and 3.5 amps) under a nitrogen atmosphere with a nitrogen gas flow of 70 sccm. Chromium was deposited in a second pass using a chrome target and an unbalanced dc magnetron operated at 12 kW power under an argon atmosphere with an argon gas flow of 91 ml/min and a web speed of 15.2 m/min.

(Layer 2) The monomer mixture of Example 14 was degassed and pumped at a flow rate of 2.79 ml/min through an ultrasonic atomizer into a vaporization chamber maintained at 274° C. Using a drum temperature of −18° C., the monomer vapor was condensed onto the moving web and electron beam crosslinked using a single filament gun operated at 7.59 kV and 2.0 milliamps.

(Layer 3) Aluminum metal was thermally evaporated onto the acrylate layer to a thickness of 30 nm using resistively heated boats and a web speed of 50 ft/min.

EXAMPLE 28

An approximately 6 by 12 inch sample of the above film was placed into a thermal vacuum forming machine used to make raised graphics for vehicular badging applications. The film was thermoformed into a recessed mold for a three-dimensional graphic spelling the motorcycle name "DUCATI"™. The thermoformed film was backfilled with a polyurethane resin and cured onto a liner whose backside was coated with a layer of pressure sensitive adhesive. The result was a non-light transmissive but intensely colored three-dimensional adhesive-backed graphic that color-shifted from magenta to green as the viewing angle changed.

Various modifications and alterations of this invention will be apparent to those skilled in the art without departing from this invention. This invention should not be restricted to that which has been set forth herein only for illustrative purposes.

We claim:

1. A conductive film comprising:
    a flexible support,
    an extensible metal layer, wherein the metal layer has a physical thickness from about 3 nm to about 50 nm,
    and a crossliniked polymeric protective layer,
    wherein the extensible metal layer is disposed between the flexible support and the crosslinked polymeric protective layer, and the film has at least one permanently deformed curved region.

2. A film according to claim 1, wherein the metal layer is substantially continuous, and the at least one permanently deformed curved region is compound curved.

3. A film according to claim 2, wherein the film is light transmissive.

4. A film according to claim 1, wherein the metal layer comprises silver and the crosslinked polymeric layer comprises an acrylate polymer.

5. A film according to claim 1, further comprising at least a second metal layer, wherein said second metal layer is also disposed between the support and the crosslinked polymeric protective layer.

6. A film according to claim 5, wherein the metal layer and the second metal layer are separated by a crosslinked polymeric spacing layer and provide an infrared-rejecting Fabry-Perot stack.

7. A film according to claim 1, wherein the metal layer or the crosslinked polymeric protective layer has been subjected to an adhesion-enhancing treatment.

8. A film according to claim 1, having a length and an electromagnetic shielding capability that is retained when the film is strained in a tensile mode by 5% of its length.

9. A film according to claim 1, having a length and an electromagnetic shielding capability that is retained when the film is strained in a tensile mode by 10% of its length.

10. A film according to claim 1, having an electromagnetic shielding capability that is retained when the film is bent at a 45° angle.

11. A film according to claim 1, that exhibits color-shifting behavior when viewed from different viewing angles.

12. A film according to claim 1, further comprising at least one planar region.

13. A film according to claim 1, further comprising a thermoplastic supplemental support.

14. An electrical device comprising the film of claim 1.

15. The device of claim 14, wherein the device is selected from the group consisting of a cell phone, a personal digital assistant, a computer and combinations thereof.

16. The device of claim 14, wherein the device comprises a heater.

17. A film according to claim 1, wherein the crosslinked polymeric protective layer further comprises an adhesion-enhancing additive.

* * * * *

UNITED STATES PATENT AND TRADEMARK OFFICE
CERTIFICATE OF CORRECTION

PATENT NO. : 7,261,950 B2  Page 1 of 1
APPLICATION NO. : 10/521827
DATED : August 28, 2007
INVENTOR(S) : Robert J. Fleming It is certified that error appears in the above-identified patent and that said Letters Patent is hereby corrected as shown below:

Title Page Item (56), Page 2,
Line 15, under "Other Publications", delete "Acrylated" under "Presentation: Shaw et al." and insert -- Acrylate --, therefor.

Column 7,
Line 52, after "350" delete "mm," and insert -- nm, --, therefor.

Column 21,
Line 4, delete "O.K" and insert -- O.K. --, therefor.

Column 24,
Line 12, delete "Aglacrylate" and insert -- Ag/acrylate --, therefor.

Column 27,
Line 67, delete "VIKUITT$^{TM}$" and insert -- VIKUITI$^{TM}$ --, therefor.

Column 28,
Line 21, delete "VIKUIKI" and insert -- VIKUITI --, therefor.

Column 29,
Line 28, in claim 1, delete "crossliniked" and insert -- crosslinked --, therefor.

Signed and Sealed this

Twenty-second Day of July, 2008

JON W. DUDAS
*Director of the United States Patent and Trademark Office*